United States Patent
Miyazaki et al.

(10) Patent No.: US 10,203,388 B2
(45) Date of Patent: Feb. 12, 2019

(54) MAGNETIC RESONANCE IMAGING APPARATUS AND MAGNETIC RESONANCE IMAGING METHOD

(71) Applicant: Toshiba Medical Systems Corporation, Otawara-shi (JP)

(72) Inventors: Mitsue Miyazaki, Des Plaines, IL (US); Xiangzhi Zhou, Vernon Hills, IL (US)

(73) Assignee: Toshiba Medical Systems Corporation, Otawara-shi (JP)

( * ) Notice: Subject to any disclaimer, the term of this patent is extended or adjusted under 35 U.S.C. 154(b) by 354 days.

(21) Appl. No.: 15/040,393

(22) Filed: Feb. 10, 2016

(65) Prior Publication Data

US 2017/0192073 A1 Jul. 6, 2017

Related U.S. Application Data

(60) Provisional application No. 62/274,641, filed on Jan. 4, 2016.

(51) Int. Cl.
*G01R 33/20* (2006.01)
*G01R 33/56* (2006.01)
*G01R 33/48* (2006.01)

(52) U.S. Cl.
CPC ..... *G01R 33/5605* (2013.01); *G01R 33/4828* (2013.01)

(58) Field of Classification Search
CPC ............... G01R 33/5605; G01R 33/4828
USPC ....................................................... 324/318
See application file for complete search history.

(56) References Cited

U.S. PATENT DOCUMENTS

| 5,557,202 | A | * | 9/1996 | Miyazaki | G01R 33/5605 324/307 |
| 5,627,468 | A | * | 5/1997 | Kojima | G01R 33/563 324/307 |
| 7,330,028 | B2 | * | 2/2008 | Zhao | G01R 33/4818 324/309 |
| 2004/0059213 | A1 | * | 3/2004 | Kassai | A61B 5/055 600/410 |
| 2006/0020197 | A1 | * | 1/2006 | Gupta | G01R 33/4824 600/410 |
| 2006/0117397 | A1 | | 6/2006 | Rutkowski et al. | |
| 2008/0221429 | A1 | * | 9/2008 | Nezafat | G01R 33/5635 600/410 |
| 2010/0207628 | A1 | * | 8/2010 | Hughes | G01R 33/5605 324/309 |

(Continued)

FOREIGN PATENT DOCUMENTS

| JP | 2008-519282 A | 6/2008 |
| JP | 2010029671 A * | 2/2010 |

(Continued)

*Primary Examiner* — Susan S Lee
(74) *Attorney, Agent, or Firm* — Oblon, McClelland, Maier & Neustadt, L.L.P.

(57) ABSTRACT

A magnetic resonance imaging apparatus according to an embodiment includes control circuitry and processing circuitry. The control circuitry executes a first pulse sequence performing MR (Magnetic Resonance) spectroscopy and configured to execute a second pulse sequence applying an MT (Magnetization Transfer) pulse. The processing circuitry causes a display to present first data acquired based on the first pulse sequence and second data acquired based on the second pulse sequence.

16 Claims, 16 Drawing Sheets

(56) References Cited

U.S. PATENT DOCUMENTS

| | | | |
|---|---|---|---|
| 2013/0166226 A1* | 6/2013 | Lee | G01R 33/5605 |
| | | | 702/30 |
| 2016/0084928 A1* | 3/2016 | Ouyang | G01R 33/5605 |
| | | | 324/309 |
| 2016/0223634 A1* | 8/2016 | Yang | G01R 33/5605 |
| 2017/0192070 A1* | 7/2017 | Miyazaki | G01R 33/485 |

FOREIGN PATENT DOCUMENTS

| | | | | |
|---|---|---|---|---|
| JP | 2015-58145 A | | 3/2015 | |
| JP | 2015144825 A | * | 8/2015 | ......... G01R 33/5605 |

\* cited by examiner

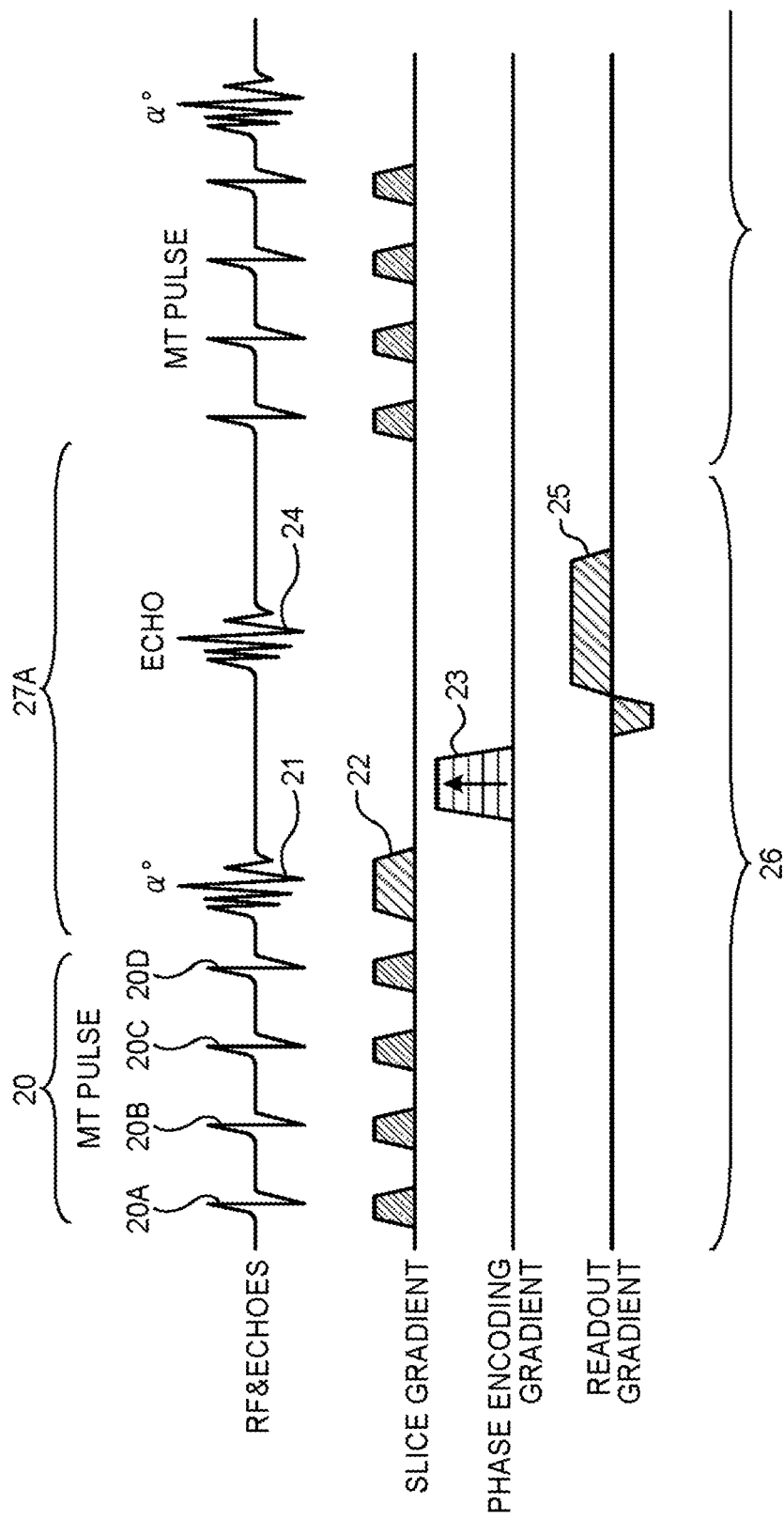

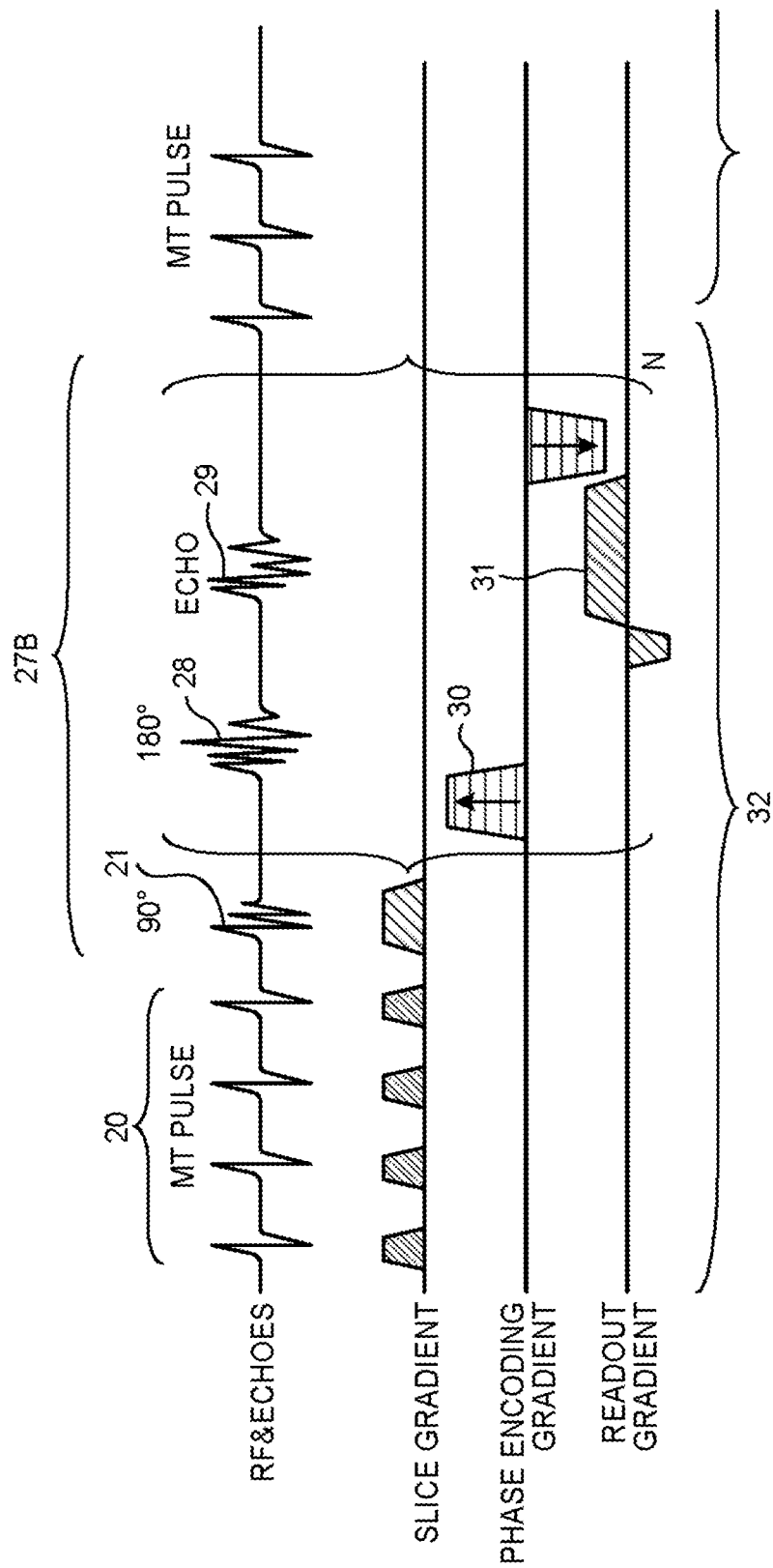

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from U.S. Provisional Application No. 62/274,641, filed on Jan. 4, 2016; the entire contents of all of which are incorporated herein by reference.

FIELD

Embodiments described herein relate generally to a magnetic resonance imaging apparatus and a magnetic resonance imaging method.

BACKGROUND

In one method of magnetic resonance imaging, there is a method known as MR (Magnetic Resonance) spectroscopy.

Protons placed in an external static magnetic field are subject to an effective magnetic field due to the magnetic screening effect originating from the surrounding electron clouds of the protons, in which the magnitude of the effective magnetic field is different from that of the external static magnetic field, where this magnitude of the effective magnetic field varies depending on the chemical environment in which the protons are being placed.

In the magnetic resonance spectroscopy, a value quantifying the difference of the resonance frequencies due to the chemical environment, known as the chemical shift, is measured. In magnetic resonance spectroscopy choosing the brain as the imaging target, for example, protons of N-Acetylaspartic acid, creatine, Choline or the like are depicted.

However, protons of the hydroxyl group (—OH), the amide group (—NH) and the amino group (—$NH_2$), for example, are invisible to the magnetic resonance spectroscopy.

BRIEF DESCRIPTION OF THE DRAWINGS

FIG. 5A and FIG. 5B are pulse sequence diagrams illustrating examples of pulse sequences executed by a magnetic resonance imaging apparatus according to embodiments;

DETAILED DESCRIPTION

A magnetic resonance imaging apparatus according to an embodiment includes control circuitry and processing circuitry. The control circuitry executes a first pulse sequence performing MR (Magnetic Resonance) spectroscopy and configured to execute a second pulse sequence applying an MT (Magnetization Transfer) pulse. The processing circuitry causes a display to present first data acquired based on the first pulse sequence and second data acquired based on the second pulse sequence.

Exemplary embodiments of a magnetic resonance imaging apparatus and a magnetic resonance imaging method will be explained below with reference to accompanying drawings. Possible embodiments are not limited to exemplary embodiments described below. In principle, the description of each exemplary embodiment is applicable to any other embodiment as well.

First Embodiment

Figure 1:
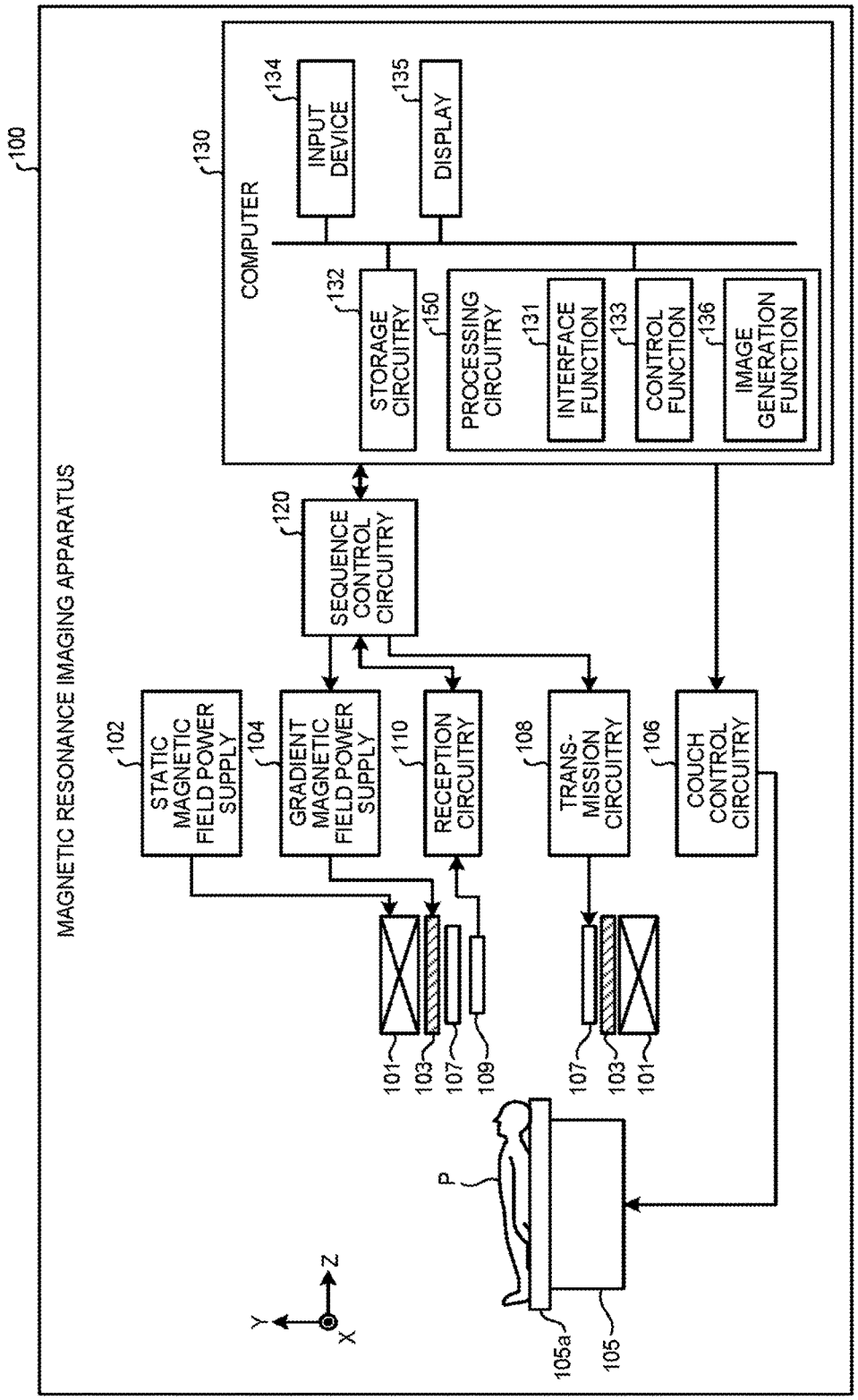
FIG. 1 is a block diagram illustrating a magnetic resonance imaging apparatus according to a first embodiment.

FIG. 1 is a block diagram of a magnetic resonance imaging apparatus 100 according to a first embodiment. As illustrated in FIG. 1, the magnetic resonance imaging apparatus 100 includes a static magnetic field magnet 101, a static magnetic field power supply 102, a gradient coil 103, a gradient magnetic field power supply 104, a couch 105, couch control circuitry 106, a transmission coil 107, transmission circuitry 108, a reception coil 109, reception circuitry 110, sequence control circuitry 120, and a computer 130 (which may be called an "image processing apparatus"). The magnetic resonance imaging apparatus 100 does not include an examined subject (such as a human body) P. The configuration illustrated in FIG. 1 is merely an example. In another example, any of the unit included in the sequence control circuitry 120 and the computer 130 may be integrated together or separated, as appropriate.

The static magnetic field magnet 101 is a magnet formed in the shape of a substantially hollow circular cylinder and generates a static magnetic field in a space on an inside thereof. The static magnetic field magnet 101 may be configured by using, for example, a superconducting magnet and is magnetically excited by receiving supply of electric current from the static magnetic field power supply 102. The static magnetic field power supply 102 supplies electric current to the static magnetic field magnet 101. Alternatively, the static magnetic field magnet 101 may be a permanent magnet, in which case the magnetic resonance imaging apparatus 100 need not comprise the static magnetic field power supply 102. Further, the static magnetic field power supply 102 may be provided separately from the magnetic resonance imaging apparatus 100.

The gradient coil 103 is a coil formed in a shape of a substantially hollow circular cylinder and is disposed on an inside of the static magnetic field magnet 101. The gradient coil 103 is formed by combining three coils corresponding to X-, Y-, and Z-axes that are orthogonal to one another. These three coils individually receive supply of electric current from the gradient magnetic field power supply 104 and generate gradient magnetic fields of which the magnetic field intensities change along the X-, Y-, and Z-axes. The gradient magnetic fields on the X-, Y-, and Z-axes that are generated by the gradient coil 103 correspond to, for example, a slice encode gradient magnetic field Gs, a phase encode gradient magnetic field Ge, and a readout gradient magnetic field Gr, respectively. The gradient magnetic field power supply 104 supplies the electric current to the gradient coil 103.

The couch 105 includes a couchtop 105a on which the subject P is placed. Under control of the couch control circuitry 106, while the subject P is placed thereon, the couchtop 105a is inserted into a hollow (i.e., an image taking opening) of the gradient coil 103. Normally, the couch 105 is provided so that a longitudinal direction thereof extends parallel to a central axis of the static magnetic field magnet 101. Under control of the computer 130, the couch control circuitry 106 drives the couch 105 so that the couchtop 105a moves in longitudinal directions and in up-and-down directions.

The transmission coil 107 is disposed on an inside of the gradient coil 103 and generates a radio frequency magnetic field by receiving a supply of a radio frequency (RF) pulse from the transmission circuitry 108. The transmission circuitry 108 supplies an RF pulse corresponding to Larmor frequency determined by a type of targeted atoms and magnetic field intensities, to the transmission coil 107.

The reception coil 109 is disposed on an inside of the gradient coil 103 and receives magnetic resonance signals (hereinafter, "MR signals", as necessary) emitted from the subject P subjected to an influence of a radio frequency magnetic field. Upon reception of magnetic resonance signals, the reception coil 109 outputs the received magnetic resonance signals to the reception circuitry 110.

The transmission coil 107 and the reception coil 109 described above are mere examples. The configuration thereof may be realized by selecting one of the following or combining together two or more of the following: a coil having only a transmission function; a coil having only a reception function; and a coil having transmission and reception functions.

The reception circuitry 110 detects the magnetic resonance signals output from the reception coil 109 and generates magnetic resonance data based on the detected magnetic resonance signals. More specifically, the reception circuitry 110 generates the magnetic resonance data by applying a digital conversion to the magnetic resonance signals output from the reception coil 109. Further, the reception circuitry 110 transmits the generated magnetic resonance data to the sequence control circuitry 120. The reception circuitry 110 may be provided on a gantry device side where the static magnetic field magnet 101, the gradient coil 103, and the like are provided.

The sequence control circuitry 120 images the subject P, by driving the gradient magnetic field power supply 104, the transmission circuitry 108, and the reception circuitry 110, on the basis of sequence information transmitted from the computer 130. The sequence information is information that defines a procedure of the imaging. The sequence information defines: an intensity of electric current to be supplied from the gradient magnetic field power supply 104 to the gradient coil 103 and a timing with which electric current is to be supplied; an intensity of an RF pulse to be supplied by the transmission circuitry 108 to the transmission coil 107 and the timing with which an RF pulse is to be applied; a timing with which magnetic resonance signals are to be detected by the reception circuitry 110, and the like. The sequence control circuitry 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, upon reception of a magnetic resonance data from the reception circuitry 110 as a result of imaging of the subject P by driving the gradient magnetic field power supply 104, the transmission circuitry 108, and the reception circuitry 110, the sequence control circuitry 120 forwards the received magnetic resonance data to the computer 130.

The computer 130 exercises overall control of the magnetic resonance imaging apparatus 100, or generates an image, and the like. The computer 130 comprises storage circuitry 132, an input device 134, a display 135 and processing circuitry 150. The processing circuitry 150 includes an interface function 131, a control function 133 and an image generation function 136.

In the first embodiment, each processing function carried out at the interface function 131, the control function 133, the image generation function 136, is stored in the storage circuitry 132 in a form of an executable program by a computer. The processing circuitry 150 is a processor realizing a function corresponding to each program by reading a program from the storage circuitry 132 and thereafter executing the program. In other words, the processing circuitry 150 in a state of having read each program has each function illustrated within the processing circuitry 150 in FIG. 1. It is noted that, in FIG. 1, it is explained that the single processing circuitry 150 realizes the processing function carried out at the interface function 131, the control function 133, or the image generation function 136. However, a plurality of independent processors may constitute the processing circuitry 150, each processor of the processing circuitry 150 executing its own program. In other words, each function described above may constitute a program and the single processing circuitry may execute each program. Alternatively, a specific function may be implemented in an independent program execution circuitry dedicated for the specific function.

Terminology "processor" used in the above explanation is meant to refer to, for example, CPU (Central Processing Unit), GPU (Graphical Processing Unit), or ASIC (Application Specific Integrated Circuit), circuitry such as programmable logic device (i.e. SPLD (Simple Programmable Logic Device), CPLD (Complex Programmable Logic Device) and FPGA (Field Programmable Gate Array). A processor reads and executes a program stored in the storage circuitry 132, thereby realizing the function.

Further, instead of being stored in the storage circuitry 132, a program may be constructed such that it is directly incorporated within circuitry of a processor. In that situation, the processor realizes a function by reading and executing the program incorporated within the circuitry. The couch control circuitry 106, the transmission circuitry 108, the reception circuitry 110 may be constructed as well, with a use of electronic circuits such as processors described above.

The processing circuitry 150 sends sequence information to the sequence control circuitry 120 by the interface function 131 and receives a magnetic resonance data from the sequence control circuitry 120. Further, upon reception of the magnetic resonance data, the processing circuitry 150 stores the received magnetic resonance data into the storage circuitry 132 by the interface function 131. When receiving the magnetic resonance data, the processing circuitry 150 having the interface function 131 stores the received magnetic resonance data in the storage circuitry 132.

The magnetic resonance data stored in the storage circuitry 132 is arranged into a k-space by the control function 133. As a result, the storage circuitry 132 stores therein a k-space data.

The storage circuitry 132 stores therein the magnetic resonance data received by the processing circuitry 150 that has the interface function 131, the k-space data arranged in the k-space by the processing circuitry 150 having the control function 133, an image data generated by the processing circuitry 150 having the image generation function 136, and the like. For example, the storage circuitry 132 is configured by using a Random Access Memory (RAM), a semiconductor memory element such as a flash memory, a hard disk, an optical disc, and the like.

The input device 134 receives various types of instructions and inputs of information from an operator. For example, the input device 134 is a pointing device such as a mouse or a trackball, a selecting device such as a mode changing switch, or an input device such as a keyboard. Under the control of the processing circuitry 150 that has the control function 133, the display 135 displays Graphical User Interface (GUI) used for receiving an input of an image taking condition and an image generated by the processing circuitry 150 that has the image generation function 136, and the like. For example, the display 135 is a display device such as a liquid crystal display device.

The processing circuitry 150 exercises overall control of the magnetic resonance imaging apparatus 100 by the control function 133 and controls image capturing processing, image generation processing, image display processing, and the like. For example, the processing circuitry 150 that has the control function 133 receives an input of the image taking condition (e.g., an image taking parameter) via the GUI and generates sequence information according to the received image taking condition. Further, the processing circuitry 150 that has the control function 133 transmits the generated sequence information to the sequence control circuitry 120.

The processing circuitry 150 reads a k-space data from the storage circuitry 132 by the image generation function 136 and generates an image through a reconstructing process such as Fourier transform on the read k-space data.

Figure 2A:
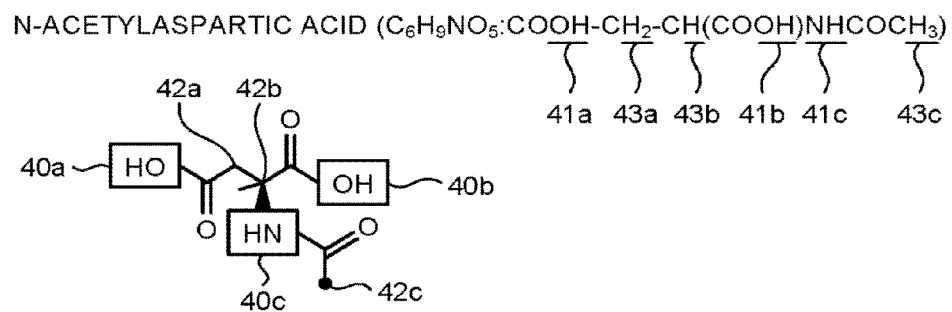
FIG. 2A, FIG. 2B and FIG. 2C are drawings explaining processing performed by a magnetic resonance imaging apparatus according to the first embodiment.
Figure 2B:
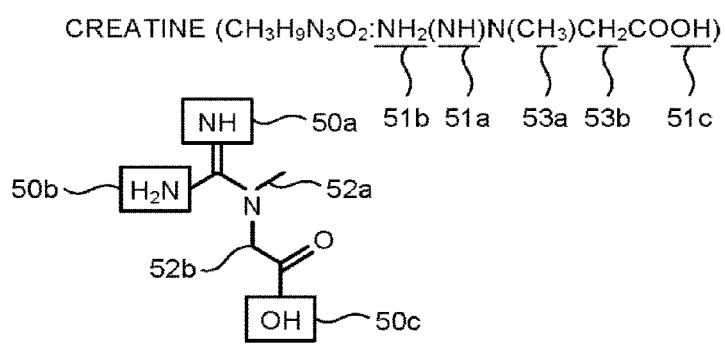
Figure 2C:
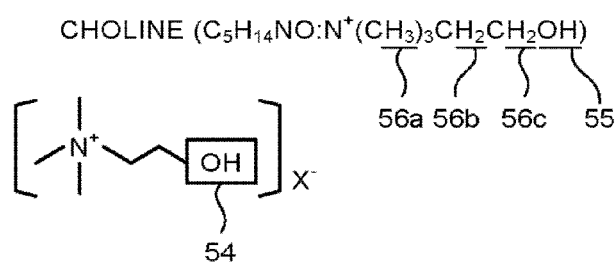

Next, with reference to FIG. 2A to FIG. 2C whenever appropriate, the background according to the magnetic resonance imaging apparatus according to embodiments are explained. FIG. 2A, FIG. 2B and FIG. 2C are drawings explaining processing performed by a magnetic resonance imaging apparatus according to the first embodiment.

In one method of magnetic resonance imaging, there is a method known as MR (Magnetic Resonance) spectroscopy. Protons placed in an external static magnetic field are subject to an effective magnetic field due to the magnetic screening effect originating from the surrounding electron clouds of the protons, in which the magnitude of the effective magnetic field is different from that of the external static magnetic field, where this magnitude of the effective magnetic field varies depending on the chemical environment in which the protons are being placed. In the magnetic resonance spectroscopy, spectroscopy is performed by measuring the chemical shift, a value quantifying the difference of the resonance frequencies due to the chemical environment. Specifically, the sequence control circuitry 120 executes a pulse sequence of the magnetic resonance spectroscopy.

In the magnetic resonance spectroscopy, for example in a case in which the brain is chosen as the imaging target, protons of N-Acetylaspartic acid, creatine, Choline or the like are depicted.

However, protons of the hydroxyl group (—OH), the amide group (—NH) and the amino group ($—NH_2$), for example, are invisible to the magnetic resonance spectroscopy. Therefore, how these protons play the role within the N-Acetylaspartic acid, the creatine, the Choline or the like cannot be visualized only by the magnetic resonance spectroscopy.

Therefore, the magnetic resonance imaging apparatus 100 according to the embodiments executes the CEST (Chemical Exchange Saturation Transfer) pulse sequence in order to visualize protons of, for example, the hydroxyl group (—OH), the amide group (—NH) or the amino group ($—NH_2$). Here, the CEST is a magnetic imaging method utilizing the fact that protons in macromolecules (such as protons in the amide group (—NH), in the hydroxyl group (—OH) or in the amino group ($—NH_2$)) and protons in free water (bulk water) are chemically exchanged.

First of all, the sequence control circuitry 120 applies a frequency-selective RF (Radio Frequency) pulse (MT (Magnetization Transfer) pulse) in a frequency away from the resonance frequency of the free water (off-resonant frequency) and at the resonance frequency of exchangeable protons (e.g. macromolecular protons). Consequently, the exchangeable protons become saturated by the MT pulses applied. Subsequently, the exchangeable protons are chemically exchanged with the free water protons. As a result, signals of the free water protons become saturated. Subsequently, the sequence control circuitry 120 applies an RF pulse corresponding to the resonance frequency of the free water protons. The sequence control circuitry 120 performs data acquisition when a predetermined time passes. In this way, the magnetic resonance imaging apparatus 100 can image the amount of the chemical exchange between the exchangeable protons and the free water protons.

In a typical situation, the $T_2$ relaxation time of the exchangeable protons in macromolecules and the like are extremely short compared to the $T_2$ relaxation time of the free water protons. Therefore, it is difficult to perform magnetic resonance imaging directly using the $T_2$ relaxation time of the exchangeable protons (magnetization of macromolecules) such as in macromolecules and the like. On the other hand, the $T_2$ relaxation time of the free water (magnetization of the free water) is suitable for magnetic resonance imaging. Thus, even in the case in which imaging directly observing the $T_2$ relaxation time of the macromolecules is difficult, by observing the magnetization of the free water protons that are suppressed through the chemical exchange (in the following, referred to as "the signal"), the magnetic resonance imaging apparatus 100 can indirectly perform imaging with respect to the macromolecular protons.

Further, the magnetic resonance spectroscopy and magnetic resonance imaging using the CEST play a complementary role. For example, in the magnetic resonance spectroscopy, spectra become blurred at high temperature due to thermal fluctuation. Therefore, in the magnetic resonance spectroscopy, image quality is degraded at the high temperature. On the contrary, image quality is improved at low temperature. On the other hand, in the magnetic resonance imaging using the CEST, since the chemical exchange becomes activated as the temperature becomes higher due to the thermal fluctuation, values of the CEST spectrum become larger as the temperature becomes higher. Consequently, in the CEST, image quality is improved at high temperature. For example, in a case of in vivo imaging, it is generally impossible to control the imaging temperature (i.e. the body temperature) freely. Therefore, it is preferable that the magnetic resonance imaging using the CEST be performed in addition to magnetic resonance spectroscopy.

By performing the magnetic resonance imaging using the CEST, the magnetic resonance imaging apparatus according to embodiments can indirectly observe protons invisible to the magnetic resonance spectroscopy. Consequently, for example, pathological regions in a tumor can be specified. Further, the magnetic resonance imaging apparatus 100 can image a conformation change of the CEST protons or tumor tissues in comparison with the normal tissues.

FIG. 2A to FIG. 2C indicate specific examples of such situations.

FIG. 2A indicates the structure formula of N-Acetylaspartic acid. Each of hydrogen atoms 43a, a hydrogen atom 43b, and hydrogen atoms 43c corresponds to, in the structure formula, hydrogen atoms covalently bound to a carbon atom 42a, a hydrogen atom covalently bound to a carbon atom 42b, hydrogen atoms covalently bound to a carbon atom 42c, respectively. The protons of these hydrogen atoms are visible to the magnetic resonance spectroscopy. On the other hand, each of an OH 41a, an OH 41b and an amide group 41c corresponds to, in the structure formula, an OH 40a constituting the carboxyl group, an amide group 40c, an OH 40b constituting the carboxyl group, respectively. The protons of the hydrogen atoms of these functional groups are invisible to the magnetic resonance spectroscopy but visible to the CEST. Therefore, by combining the magnetic resonance spectroscopy and the CEST, the magnetic resonance imaging apparatus 100 can obtain knowledge on the roles of these OHs and NHs within the N-Acetylaspartic acid. N-Acetylaspartic acid is a free amid acid abound in the cerebral part of mammals. Measurement of the concentration of the N-Acetylaspartic acid is considered to be useful for diagnosis of, for example, brain injury, the Alzheimer's disease or schizophrenia.

FIG. 2B indicates the structure formula of creatine. Each of hydrogen atoms 53a and hydrogen atoms 53b corresponds to, in the structure formula, hydrogen atoms covalently bound to a carbon atom 52a, hydrogen atoms covalently bound to a carbon atom 52b respectively. The protons of these hydrogen atoms are visible to the magnetic resonance spectroscopy. On the other hand, each of an NH 51a, an amino group 50b and an OH 51c corresponds to, in the structure formula, an NH 50a an amino group 50c and an OH 50c constituting the carboxyl group, respectively. Protons of the hydrogen atoms of these functional groups are invisible to the magnetic resonance spectroscopy but visible to the CEST. Therefore, by combining the magnetic resonance spectroscopy and the CEST, the magnetic resonance imaging apparatus 100 can obtain knowledge on the roles of these OHs, NHs and $NH_2$s within the creatine. Creatine is a substance naturally existing in human cells, such as in the brain, in the muscles, in the neurotic cells and the like and is a substance that plays the role of storing energy. Measurement of the concentration of the creatine is considered to be useful for diagnosis of, for example, muscular diseases.

FIG. 2C indicates the structure formula of Choline. Similarly to FIG. 2A or FIG. 2B, protons of hydrogen atoms 56a, hydrogen atoms 56b and hydrogen atoms 56c are visible to the magnetic resonance spectroscopy. On the other hand, a hydroxyl group 55 corresponds to a hydroxyl group 54 in the structure formula. The hydrogen protons of the hydroxyl group 54 are invisible to the magnetic resonance spectroscopy but visible to the CEST. Therefore, by combining the magnetic resonance spectroscopy and the CEST, the magnetic resonance imaging apparatus 100 can obtain knowledge on the roles of the hydroxyl group within the Choline. Choline is a water-soluble nutrient essential to constructing and repairing cell membranes. Measurement of the concentration of the Choline is considered to be useful for determining, for example, a proliferation rate of tumor tissues.

Figure 3:
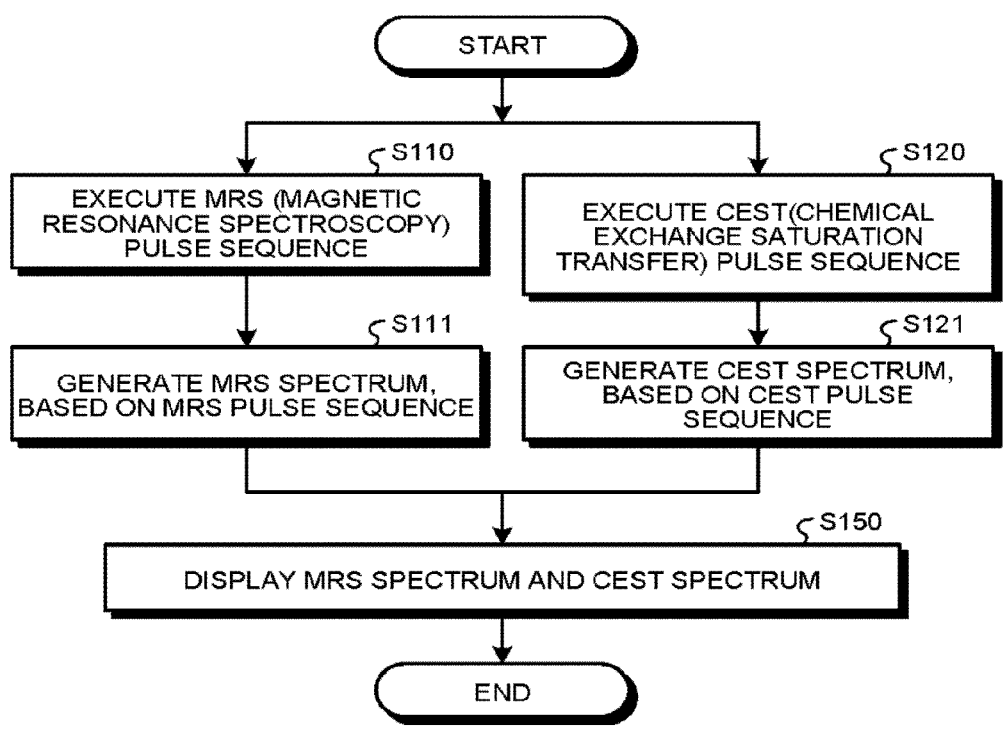
FIG. 3 is a flowchart of explaining an example of procedure of processing performed by a magnetic resonance imaging apparatus according to the first embodiment.
Figure 4:
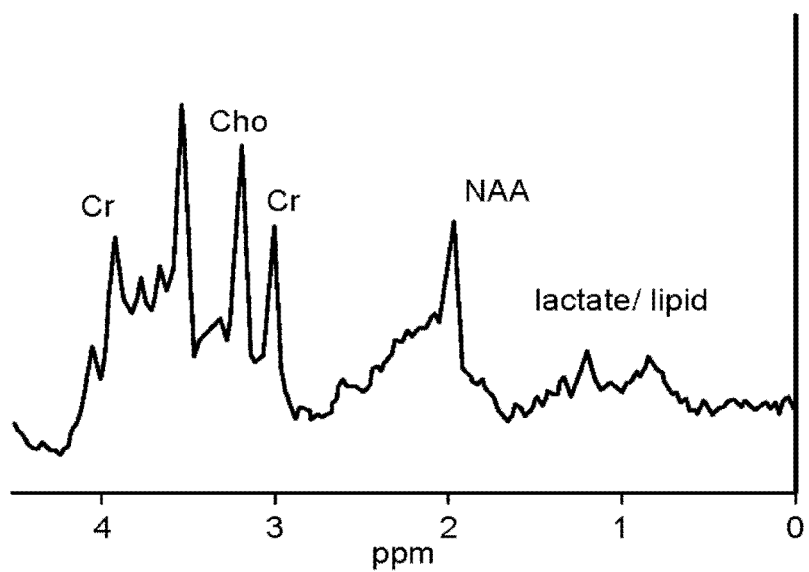
FIG. 4 is a drawing explaining processing performed by the magnetic resonance imaging apparatus according to the first embodiment.
Figure 10:
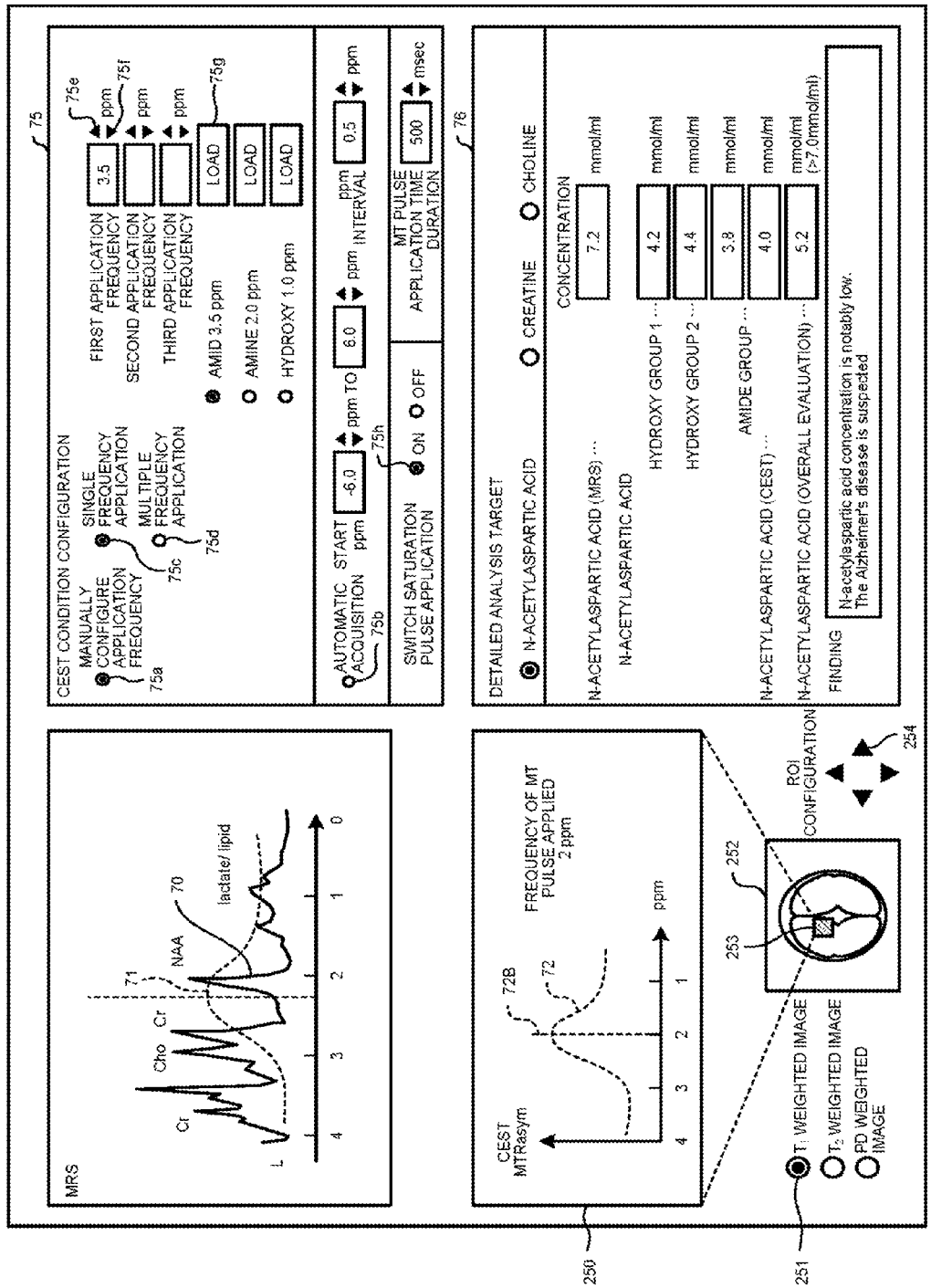
FIG. 10 is a drawing illustrating an example of a GUI according to embodiments.

Next, with reference to FIG. 4 to FIG. 7D and FIG. 10, whenever appropriate, procedure of processing performed by the magnetic resonance imaging apparatus according to the first embodiment is explained with reference to FIG. 3. FIG. 3 is a flowchart of explaining an example of procedure of processing performed by a magnetic resonance imaging apparatus according to the first embodiment. FIG. 4 is a drawing explaining processing performed by the magnetic resonance imaging apparatus according to the first embodiment. FIG. 5A and FIG. 5B are pulse sequence diagrams illustrating examples of pulse sequences executed by a magnetic resonance imaging apparatus according to embodiments. FIG. 6A, FIG. 6B, FIG. 6C, FIG. 7A, FIG. 7B, FIG. 7C and FIG. 7D are drawings explaining procedure performed by the magnetic resonance imaging apparatus according to the first embodiment. FIG. 10 is a drawing illustrating an example of a GUI according to embodiments.

First of all, the sequence control circuitry 120 executes a pulse sequence of the magnetic resonance spectroscopy (Step S110). In other words, the sequence control circuitry 120 executes a first pulse sequence performing MR (Magnetic Resonance) spectroscopy. As an example, the sequence control circuitry 120 executes a STEAM (Stimulated Echo Acquisition Mode) sequence. Further, as an example, the sequence control circuitry 120 executes a PRESS (Point Resolved Spectroscopy Sequence) sequence. Further, as an example, the sequence control circuitry 120 executes a LASER (Localization By Adiabatic Selective Focusing) sequence.

Subsequently, the processing circuitry 150 generates an MRS (magnetic resonance spectroscopy) spectrum based on the pulse sequence of the magnetic resonance spectroscopy executed by the sequence control circuitry 120 by the image generation function 136 (Step S111). FIG. 4 is an example of a magnetic resonance spectrum generated in this way. The vertical line indicates signal intensity. Further, the horizontal axis indicates the chemical shift (frequency). Peaks corresponding to N-Acetylaspartic acid (NAA), creatine (Cr), Choline (Cho) appear in FIG. 4. On the other hand, peaks of the hydroxyl group OH, the amino group $NH_2$ or the amide group NH and the like cannot be observed in FIG. 4.

On the other hand, the sequence control circuitry 120 executes the CEST pulse sequence (Step S120). In other words, the sequence control circuitry 120 executes a second pulse sequence applying an MT (Magnetization Transfer) pulse. As the CEST pulse sequence, the sequence control circuitry 120 executes a pulse sequence, for example, illustrated in FIG. 5A or a pulse sequence illustrated in FIG. 5B.

FIG. 5A illustrates an example of a pulse sequence in which the sequence control circuitry 120 performs high-speed imaging using a pulse sequence using, for example, a gradient echo method. The top row in FIG. 5A indicates RF pulses applied by the sequence control circuitry 120 and echoes generated by the RF pulses and gradient magnetic fields. The second row in FIG. 5A represents a slice gradient applied by the sequence control circuitry 120. The third row in FIG. 5A represents a phase encoding gradient 23 applied by the sequence control circuitry 120. The fourth row in FIG. 5A represents a readout gradient applied by the sequence control circuitry 120.

A pre-sequence 20 indicates a sequence in which MT pulses are applied prior to an imaging sequence 27A (also referred to as the main sequence). The imaging sequence 27A represents an imaging sequence in which an imaging is performed. The sequence control circuitry 120 applies, for example, an MT pulse 20A, an MT pulse 20B, an MT pulse 20C and an MT pulse 20D during the pre-sequence 20. Each of the MT pulse 20A, the MT pulse 20B, the MT pulse 20C and the MT pulse 20D is a frequency-selective RF pulse generated, for example, by a sin c function. Further, the MT pulse 20A, the MT pulse 20B, the MT pulse 20C and the MT pulse 20D are, for example, binomial pulses.

Subsequently, the sequence control circuitry 120 starts the imaging sequence 27A. The sequence control circuitry 120 applies, for example, an α-degrees pulse 21 during the imaging sequence 27A. Simultaneously, the sequence control circuitry 120 applies a slice encode gradient 22. Subsequently, the sequence control circuitry 120 applies a phase encoding gradient 23. Subsequently, the sequence control circuitry 120 applies a readout gradient 25. Consequently, an echo 24 is generated. The sequence control circuitry 120 applies the readout gradient 25 during the time period in which the echo 24 is generated, thereby performing data acquisition while the echo 24 is generated.

Thus, the pre-sequence 20 and the imaging sequence 27A constitute a TR 26 (Repetition Time), which is the repetition unit of the pulse sequence. In this way, upon completion of one unit of repetition, the sequence control circuitry 120 changes the amount of phase encoding or the frequency of the MT pulses and executes the pulse sequence of the next repetition unit.

In FIG. 5A, a case is explained in which the sequence control circuitry 120 performs imaging, using a high-speed repetition sequence by applying the α-degrees pulse 21. In FIG. 5B, a case is explained in which the sequence control circuitry 120 performs imaging using a pulse sequence generating a plurality of echoes (multi-echo) for one set of MT pulses.

Similarly to FIG. 5A, the sequence control circuitry 120 applies MT pulses during a pre-sequence 20. Subsequently, the sequence control circuitry 120 starts an imaging sequence 27B, which is performed together with the pre-sequence 20 in a time period 32. The sequence control circuitry 120 applies a 90-degrees pulse 21. Simultaneously, the sequence control circuitry 120 applies a slice gradient magnetic field. Subsequently, the sequence control circuitry applies a phase encoding gradient 30. Subsequently, the sequence control circuitry 120 applies a 180-degrees pulse 28. Subsequently, the sequence control circuitry 120 applies a readout gradient 31. At this time, an echo 29 is generated. The sequence control circuitry 120 applies the readout gradient 31 during a time period in which the echo 29 is generated and performs data acquisition while the echo 29 is generated.

Further, in the embodiments, as for the imaging sequence applied by the sequence control circuitry 120, various examples are considered aside from the examples of FIG. 5A and FIG. 5B. The sequence control circuitry 120 may, for example, employ 2D (two dimensional) scan or employ 3D (three dimensional) scan as the imaging sequence. The sequence control circuitry 120 may, for example, employ a SE (Spin Echo) sequence, a FE (Field Gradient Echo) sequence, a FSE (Fast SE) sequence, a FASE (Fast Asymmetric Spin Echo) sequence and the like.

Subsequently, the processing circuitry 150 generates a CEST spectrum (the Z spectrum) or the MTRasym spectrum based on the CEST pulse sequence executed at Step S120 by the sequence control circuitry 120 executes at Step S120 (Step S121).

The CEST effect is described using the Z spectrum or the MTRasym spectrum. By the image generation function 136, the processing circuitry 150 generates the Z spectrum or the MTRasym spectrum based on data acquired by the pulse sequence executed by the sequence control circuitry 120.

The Z spectrum is a spectrum representing the signal intensity when an RF pulse corresponding to the free water protons is applied after application of the MT pulses, as a function of the frequency of the MT pulses that are applied.

In a case in which the CEST effect does not exist, only the effect of saturation of the free water protons is reflected on the Z spectrum. Consequently, the Z spectrum becomes a symmetrical spectrum with respect to the origin where the resonance frequency of the free water protons is taken as the reference. On the other hand, in a case in which the CEST effect exists, the CEST effect being reflected, the Z spectrum becomes an asymmetric spectrum with respect to the origin where the resonance frequency of the free water protons is taken as the reference. For example, in a case in which the frequency of the MT pulses applied by the sequence control circuitry 120 is "2 ppm", then protons in the amino group become saturated due to the MT pulses and are chemically exchanged with the free water protons. Consequently, the signal value becomes lowered. On the other hand, in a case in which the frequency of the MT pulses applied by the sequence control circuitry 120 is "−2 ppm", then protons that are chemically exchangeable with the free water protons do not exist at "−2 ppm". Therefore, the signal value is not lowered.

In other words, a quantity indicating the degree of asymmetry of the Z spectrum becomes the quantity indicating the amount of the CEST effect. The MTRasym spectrum is a quantity indicating the CEST effect.

For example, let "$S_-$" be the signal intensity in a case in which an MT pulse with the frequency of "−x ppm" is applied. In addition, let "$S_+$" be the signal intensity in a case in which an MT pulse with the frequency of "+x ppm" (the opposite position) is applied. Further, let "$S_0$" be the signal intensity in a case in which no MT pulse is applied. Then, the MTRasym spectrum at the frequency "x ppm" shall be obtained, for example, by the following equation: "$(S_+ - S_-)/S_0$".

Figure 6A:
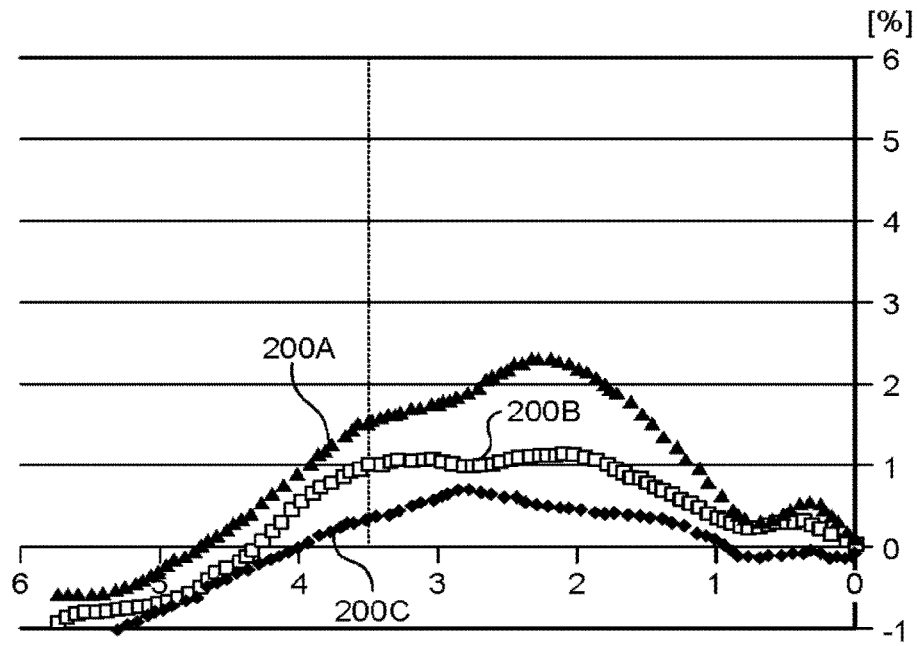
FIG. 6A, FIG. 6B, FIG. 6C, FIG. 7A, FIG. 7B, FIG. 7C and FIG. 7D are drawings explaining procedure performed by the magnetic resonance imaging apparatus according to the first embodiment.
Figure 6B:
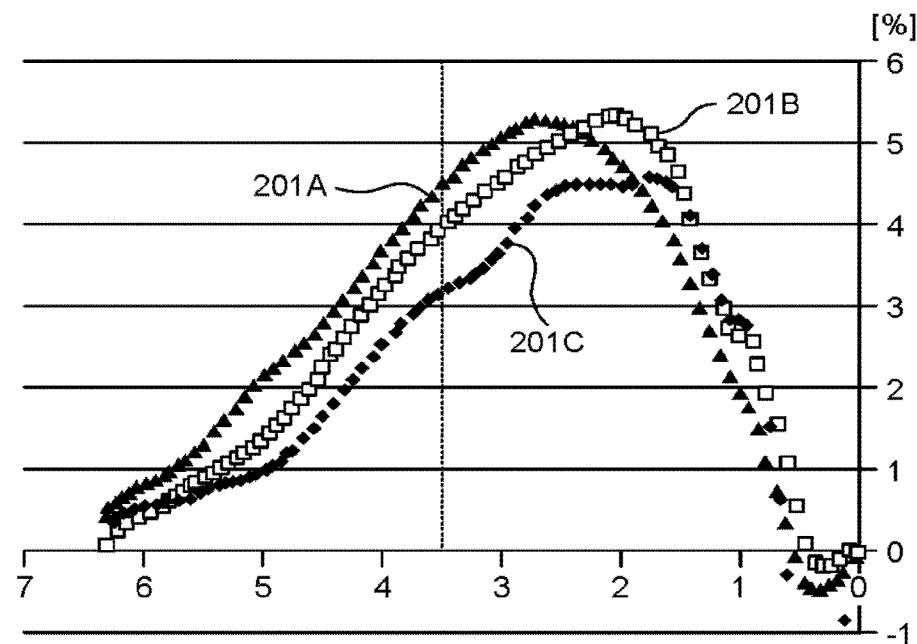
Figure 6C:
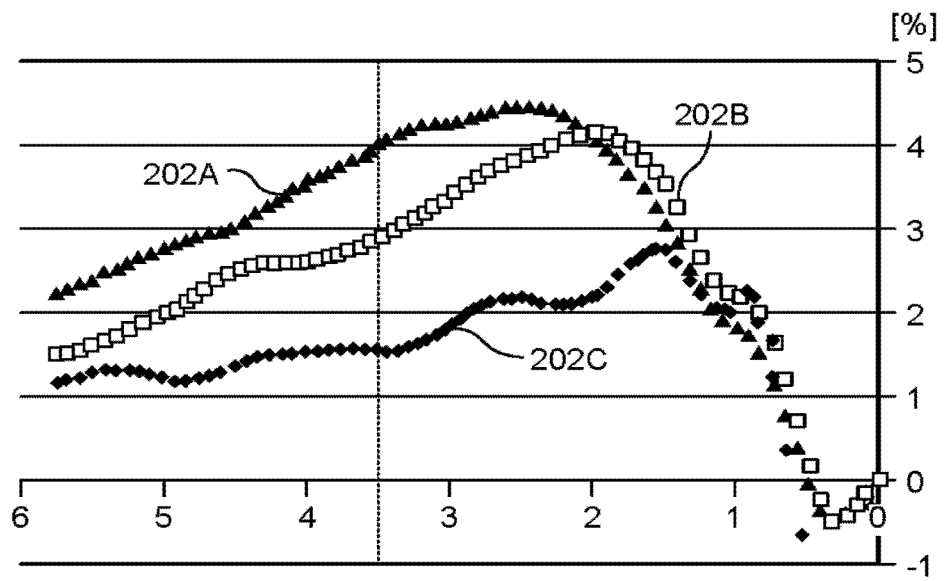

FIG. 6A to FIG. 6C indicate examples of the MTRasym spectra generated in this way by the processing circuitry 150.

FIG. 6A indicates the MTRasym spectra of the normal tissues when the application time duration of the MT pulses applied by the sequence control circuitry 120 is changed. The horizontal line indicates the frequency in the unit of ppm. A curve 200A represents the MTRasym spectrum of the normal tissues in a case in which the application time of the MT pulses applied by the sequence control circuitry 120 is long. A curve 200B represents the MTRasym spectrum of the normal tissues in a case in which the application time of the MT pulses applied by the sequence control circuitry 120 is normal. A curve 200C represents the MTRasym spectrum of the normal tissues in a case in which the application time of the MT pulses applied by the sequence control circuitry 120 is short. The longer does the time duration of the MT pulse applied by the sequence control circuitry 120 become, the larger does the value of the MTRasym spectrum become.

FIG. 6B indicates the MTRasym spectra of tumor tissues when the application time duration of the MT pulses applied by the sequence control circuitry 120 is changed. The horizontal line indicates the frequency in the unit of ppm. Similarly, each of a curve 201A, a curve 201B and a curve 201C represents the MTRasym spectrum of tumor tissues in a case in which the application time of the MT pulses which the sequence control circuitry 120 applies is long, normal and short, respectively. Further, FIG. 6C indicates the difference between the MTRasym spectrum of the normal tissues and the MTRasym spectrum of tumor tissues in a case in which the application time duration of the MT pulses applied by the sequence control circuitry 120 changes. The horizontal axis indicates the frequency in the unit of ppm. Each of a curve 202A, a curve 202B and a curve 202C represents the difference between the MTRasym spectrum of the normal tissues in a case in which the application duration time of the MT pulses applied by the sequence control circuitry 120 is long, normal and short, respectively and the MTRasym spectrum of tumor tissues. In other words, the longer does the application time duration of the MT pulses become, the larger does the difference between the MTRasym spectrum of the normal tissues and the MTRasym spectrum of tumor tissues become.

Next, the processing circuitry 150 causes a display 135 serving as a display unit to display first data acquired based on the first pulse sequence and second data acquired based on the second pulse sequence. Specifically, by the control function 133, the processing circuitry 150 causes the display 135 to display the MRS spectrum generated at Step S111 by the image generation function based on the pulse sequence of the magnetic resonance spectroscopy and a spectrum representing the CEST effect generated at Step S121 by the image generation function 136 based on the CEST pulse sequence. The display 135 displays the MRS spectrum and the spectrum representing the CEST effect (Step S150). In other words, the processing circuitry causes the display 135 to present the MRS spectrum acquired based on the first pulse sequence and a spectrum acquired base on the second pulse sequence and indicating the amount of the CEST effect (e.g. the Z spectrum, the MTRasym spectrum and the like).

FIG. 7A to FIG. 7D indicate examples of the MRS spectra and spectra indicating the CEST effect displayed by the display 135.

Figure 7A:
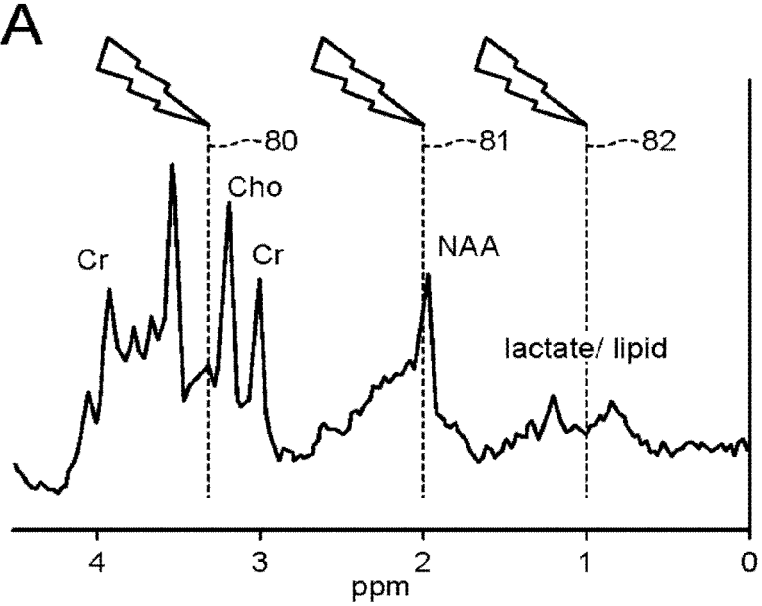
Figure 7B:
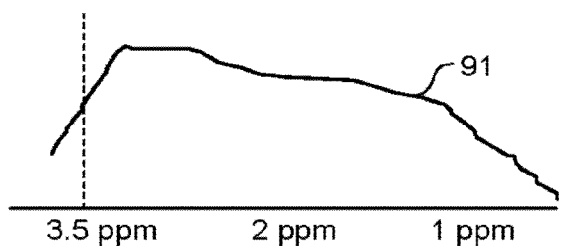
Figure 7C:
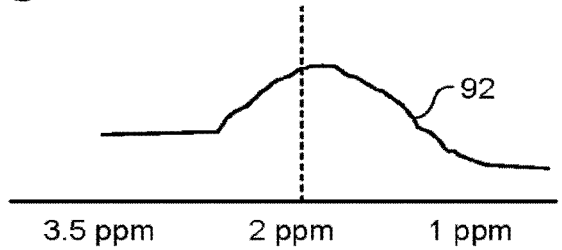
Figure 7D:
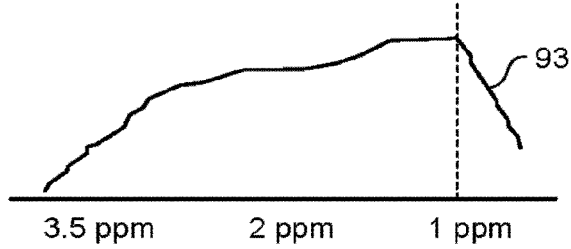

FIG. 7A is an example of the MRS spectrum which the processing circuitry 150 generates at Step S101 by the image generation function 136 and which the display 135 displays at Step S150. The horizontal axis indicates the frequency in the unit of ppm. In the MRS spectrum, peaks of N-Acetylaspartic acid, creatine, Choline and the like appear. A dotted line 80 indicates the frequency of the MT pulse corresponding to the amide group (3.5 ppm). In FIG. 7B to be described later, the sequence control circuitry 120 applies MT pulses at the frequency of the dotted line 80. A dotted line 81 indicates the frequency of the MT pulse corresponding to the amino group (2.0 ppm). In FIG. 7C to be described later, the sequence control circuitry applies MT pulses at the frequency of the dotted line 81. A dotted line 82 indicates the frequency of the MT pulse corresponding to the hydroxyl group (1.0 ppm). In FIG. 7D to be described later, the sequence control circuitry applies MT pulses at the frequency of the dotted line 82. As illustrated in FIG. 7A, in the MRS spectrum, spectra corresponding to the amide group (3.5 ppm), the amino group (2.0 ppm) and the hydroxyl group (1.0 ppm) are not observed.

In FIG. 7B, an MTRasym spectrum 91 indicates the MTRasym spectrum in a case in which the sequence control circuitry 120 applies the MT pulses at the frequency corresponding to the amide group (3.5 ppm). The horizontal axis indicates the frequency in the unit of ppm. The MTRasym spectrum 91 has a peak in the vicinity of 3.5 ppm.

In FIG. 7C, an MTRasym spectrum 92 indicates the MTRasym spectrum in a case in which the sequence control circuitry 120 applies the MT pulses at the frequency corresponding to the amino group (2.0 ppm). The horizontal axis indicates the frequency in the unit of ppm. The MTRasym spectrum 92 has a peak in the vicinity of 2.0 ppm.

In FIG. 7D, an MTRasym spectrum 93 indicates the MTRasym spectrum in a case in which the sequence control circuitry 120 applies the MT pulses at the frequency corresponding to the hydroxyl group (1.0 ppm). The horizontal axis indicates the frequency in the unit of ppm. The MTRasym spectrum 93 has a peak in the vicinity of 1.0 ppm.

In FIG. 10, at Step S150, an example of a screen which the display 135 displays is illustrated. In FIG. 10, what is not explained in the first embodiment will be explained later in at least one of the other embodiments.

In the top-left part of FIG. 10, by the control function 133, the processing circuitry 150 causes the display 135 to display an MRS spectrum 70 and an MTRasym spectrum 71. The display 135, for example, displays the MRS spectrum 70 and the MTRasym spectrum 71 in a superimposed manner. The vertical axis represents the intensity of the spectra. The horizontal axis represents the frequency in the unit of ppm.

As described above, the magnetic resonance imaging apparatus 100 according to the first embodiment is explained. However, embodiments are not limited to this situation and various modification examples may be considered.

For example, the order of the execution of Step S110 and Step S111 and the order of the execution of Step S120 and Step S121 may be arbitrary. For example, the sequence control circuitry 120 may execute Step S120 subsequent to the execution of Step S110. On the contrary, the sequence control circuitry 120 may execute Step S110 subsequent to the execution of Step S120. Further, the sequence control circuitry 120 may execute Step S110 and Step S120 concurrently. Similarly, the processing circuitry 150 may execute Step S121 subsequent to the execution of Step S111. On the contrary, the processing circuitry 150 may execute Step S111 subsequent to the execution of Step S121. Further, the processing circuitry 150 may execute Step S121 and Step S111 concurrently. Further, for example, the sequence control circuitry 120 may execute Step S120 subsequent to the execution of Step S111 by the processing circuitry 150.

In the first embodiment, a case in which the sequence control circuitry 120 executes both the pulse sequence corresponding to the magnetic resonance spectroscopy and the pulse sequence corresponding to the CEST is explained. However, embodiments are not limited to this situation. For example, the execution of the pulse sequence corresponding to the CEST is optional.

For example, the sequence control circuitry 120 executes, as the first step, a first pulse sequence executing the magnetic resonance spectroscopy. By the image generation function 136, the processing circuitry 150 generates an MRS spectrum, based on the pulse sequence corresponding to the magnetic resonance spectroscopy thus executed. By the control function 133, the processing circuitry 150 causes the display 135 to display the MRS spectrum generated and accepts an input from a user. The user having watched the screen displayed on the display 135, for example, watches the MRS spectrum image serving as the image for the screening test. In a case in which the user determines that no abnormal finding is found, the user inputs an input that no further examination using the CEST is necessary. Further, in a case in which the user having watched the screen displayed on the display 135 watches the MRS spectrum image as the image for the screening test and determines that abnormal finding is found and that a detailed examination is necessary, the user inputs an input that a further examination using the CEST is to be performed. In a case in which by the input device 134 the computer 130 accepts the input that the further examination using the CEST is to be performed, the sequence control circuitry 120 executes a second pulse sequence applying MT pulses. By the image generation circuitry 136, the processing circuitry 150 generates a spectrum indicating the CEST effect or the MTRasym spectrum, based on the second data acquired based on the second pulse sequence. By the control function 133, the processing circuitry 150 causes the display 135 to display the spectrum indicating the CEST effect acquired or the MTRasym spectrum.

Further, the determination as to whether the further examination is to be performed using the CEST is not necessarily done manually by accepting the input from the user. The determination as to whether the further examination is to be performed using the CEST is, for example, determined automatically by the processing circuitry 150. In such a case, by the function not illustrated, the processing circuitry 150 determines whether or not the further examination using the CEST is to be performed based on the MRS spectrum serving as the image for the screening test. For example, in a case the processing circuitry 150 detects a spectrum known as the MRS spectrum image in the case of a malignant tumor, the processing circuitry 150 determines that the further examination using the CEST is to be performed.

In a case in which the processing circuitry 150 determines that the further examination is to be performed by the determination function not illustrated, the processing circuitry 150 executes the second pulse sequence applying the MT pulses.

Further, the magnetic resonance imaging apparatus 100 may comprise a GUI (Graphical User Interface) that causes the display 135 to concurrently present a normal magnetic resonance image. In the bottom-left part of FIG. 10, an example of a screen which the processing circuitry 150 causes the display 135 to display those images by the control function 133 is illustrated.

By the control function 133, the processing circuitry 150 causes the display 135 to present a magnetic resonance image 252. Here, the magnetic resonance image 252 is, for example, a magnetic resonance image acquired by the sequence control circuitry 120 executing other pulse sequences. Further, the magnetic resonance image 252 is, for example, a magnetic resonance image generated by other pieces of magnetic resonance imaging apparatus. As an example of the magnetic resonance image, for example, $T_1$ weighted images, $T_2$ weighted images, PD (Proton Density) weighted images and the like can be considered. The user can switch the type of the magnetic resonance image 252 that is displayed by switching a button 251. It is noted that the ROI (Region of Interest) in which the magnetic resonance spectroscopy is performed and the ROI in which the CEST is performed is preferably chosen to be the same.

By the control function 133, the processing circuitry 150 may display the ROI (Region of Interest) in which the magnetic resonance spectroscopy is performed on the display 135. Further, by the control function 133, the processing circuitry 150 may display the ROI in which the CEST is performed on the display 135. In FIG. 10, by the control function 133, the processing circuitry 150 causes a region 253, which is the ROI in which the CEST is performed, to be displayed on the display 135. Further, by the control function 133, the processing circuitry 150 causes a graph 250 representing an MTRasym spectrum 72 of the ROI (or a CEST spectrum) to be displayed on the display 135 by popping it up on the screen.

Further, the processing circuitry 150 may accept, from the user, an input of the ROI in which the magnetic resonance spectroscopy is performed. Further, the processing circuitry 150 may accept, from the user and by the input device 134, an input of the ROI in which the CEST is performed. The user can configure the ROI in which the CEST is performed, for example, by a button 254.

Further, the second pulse sequence which the sequence control circuitry 120 executes is not limited to the example of a case in which data is sequentially acquired for a single slice. For example, the sequence control circuitry 120 may execute the second pulse sequence by concurrently acquiring data for a plurality of slices.

As described above, in the first embodiment, by the control function 133, the processing circuitry 150 performs a control, causing the CEST spectrum or the MTRasym spectrum in addition to the MRS spectrum to be displayed on the display 135. Hence, for example, it is possible to provide the user with, for example, information on functional groups invisible to the magnetic resonance spectroscopy or information at temperatures in which peaks are blurred in the magnetic resonance spectroscopy. As a result, information can be output from the multiple points of view, enabling the improvement of diagnosis accuracy.

Second Embodiment

In the first embodiment, a case is explained in which the sequence control circuitry 120 executes the first pulse sequence executing the magnetic resonance spectroscopy (the pulse sequence of the magnetic resonance spectroscopy) and the second pulse sequence applying MT pulses (the CEST pulse sequence) and the processing circuitry 150 causes the display 135 to display the first data acquired based on the first pulse sequence and the second data acquired based on the second pulse sequence. However, embodiments are not limited to this situation.

In the second embodiment, a case is explained in which the sequence control circuitry 120 applies MT pulses in a predetermined frequency prior to the pulse sequence of the magnetic resonance spectroscopy when acquiring the MRS spectrum. Due to this processing, a change appears in the MRS spectrum. Therefore, for example, the processing circuitry 150 performs a subtraction processing between the MRS spectrum acquired in a case in which no MT pulse is applied and the MRS spectrum acquired in a case in which MT pulses are applied, thereby capable of utilizing the acquired spectrum for diagnosis.

At this time, the frequency of the MT pulses which the sequence control circuitry 120 applies prior to the pulse sequence of the magnetic resonance spectroscopy may be determined based on data generated based on the CEST pulse sequence previously executed (e.g. based on the MTRasym spectrum). Further, the frequency of the MT pulses which the sequence control circuitry 120 applies prior to the pulse sequence of the magnetic resonance spectroscopy, for example, may be determined based on the input from the user which the processing circuitry 150 accepted by the interface function 131 through the input device 134.

Figure 8A:
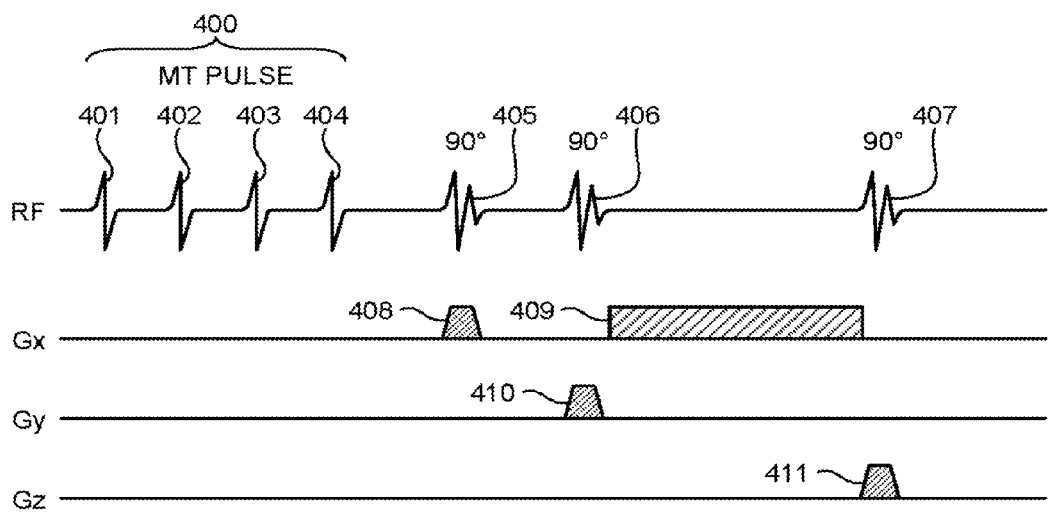
FIG. 8A and FIG. 8B are pulse sequence diagrams illustrating examples of pulse sequences executed by a magnetic resonance imaging apparatus according to a second embodiment.
Figure 8B:
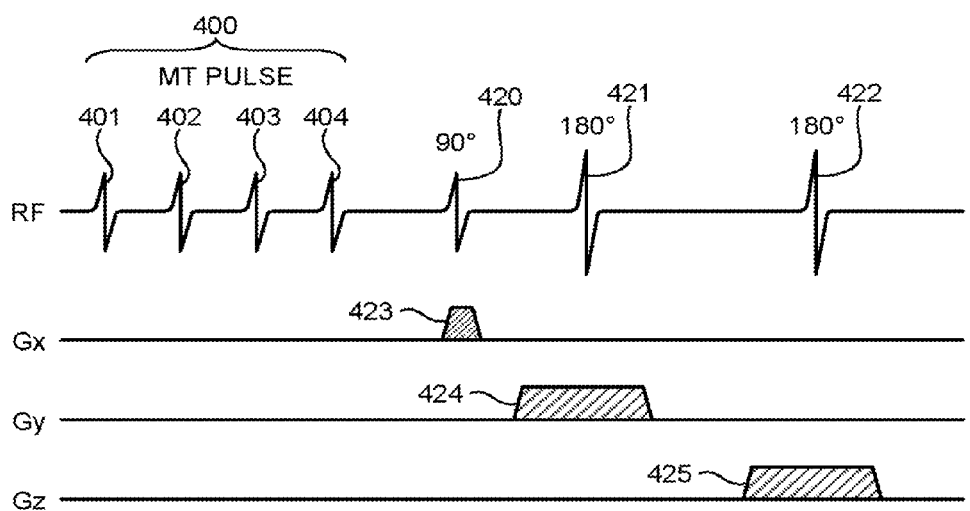

FIG. 8A and FIG. 8B are pulse sequence diagrams illustrating examples of pulse sequences executed by a magnetic resonance imaging apparatus according to the second embodiment.

The sequence control circuitry 120 applies MT pulse(s), and executes a pulse sequence performing magnetic resonance spectroscopy after the MT pulse(s) are applied.

In FIG. 8A, a case is explained in which the sequence control circuitry 120 execute a STEAM (Stimulated Echo Acquisition Mode) sequence as the pulse sequence performing the magnetic resonance spectroscopy.

The top row of FIG. 8A indicate RF pulses which the sequence control circuitry 120 applies. Each of the second row, the third row, the fourth row of FIG. 8A indicates a gradient magnetic field in the x direction, in the y direction and in the z direction, respectively, applied by the sequence control circuitry 120.

A pre-sequence 400 indicates a sequence applied by the sequence control circuitry 120 prior to the pulse sequence executed by the magnetic resonance spectroscopy (in the case of FIG. 8A, the STEAM sequence). Each of an MT pulse 401, 402, 403 and 404 indicates an MT pulse applied by the sequence control circuitry 120 during the pre-sequence 400. Each of a 90-degrees pulse 405, 406 and 407 indicates a 90-degrees RF pulse applied by the sequence control circuitry 120. Each of a gradient magnetic field 408, 410 and 411 indicates a gradient magnetic field applied by the sequence control circuitry 120 in the x direction, in the y direction and in the z direction, respectively, simultaneously with the 90-degrees pulse 405, 406 and 407, respectively. A crusher gradient 409 for dephasing signals that are other than the target signals are applied by the sequence control circuitry 120 during the so-called mixing time, which is a time period between the application of the 90-degrees pulse 406 and the 90-degrees pulse 407.

In FIG. 8B, a case is explained in which the sequence control circuitry 120 execute a PRESS (Point Resolved Spectroscopy Sequence) sequence as the pulse sequence performing magnetic resonance spectroscopy.

The top row of FIG. 8B indicates RF pulses which the sequence control circuitry 120 applies. Each of the second row, the third row, the fourth row of FIG. 8B indicates a gradient magnetic field in the x direction, in the y direction and in the z direction, respectively, applied by the sequence control circuitry 120.

A pre-sequence 400 indicates a sequence applied by the sequence control circuitry 120 prior to the pulse sequence in which the magnetic resonance spectroscopy is performed (PRESS sequence in the case of FIG. 8B). Each of an MT pulse 401, 402, 403 and 404 indicates an MT pulse applied by the sequence control circuitry 120 during the pre-sequence 400. A 90-degrees pulse 420 indicates a 90-degrees RF pulse applied by the sequence control circuitry 120. 180-degrees pulse 421 and 422 indicate refocus RF pulses applied by the sequence control circuitry 120. A gradient magnetic field 423 indicates a gradient magnetic field applied by the sequence control circuitry 120 in the x direction simultaneously with the 90-degrees pulse 420. In order to avoid the occurrence of coherence by signals that are other than the target signals, crusher gradients 424 and 425 are applied concurrently with those refocus pulses.

Figure 8C:
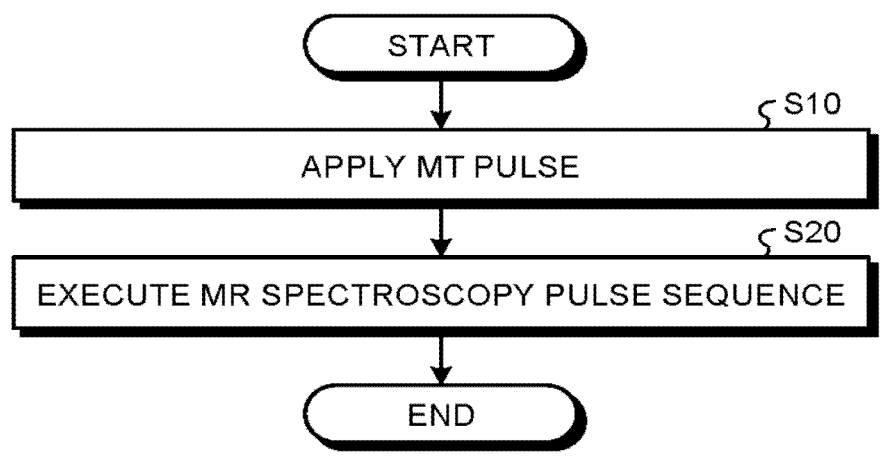
FIG. 8C is a flowchart for explaining an example of procedure of processing performed by a magnetic resonance imaging apparatus according to the second embodiment.

FIG. 8C is a flowchart for explaining an example of procedure of processing performed by a magnetic resonance imaging apparatus according to the second embodiment.

First of all, the processing circuitry 150 applies MT pulses (Step S10). For example, in FIG. 8A or FIG. 8B, the processing circuitry 150 applies the MT pulse 401, 402, 403 and 404 during the pre-sequence 400.

Subsequently, the processing circuitry 150 executes a pulse sequence of the magnetic resonance spectroscopy (Step S20). For example, the processing circuitry 150 executes the STEAM sequence as illustrated in FIG. 8A. In an alternative example, the processing circuitry 150 executes the PRESS sequence as illustrated in FIG. 8B. In an alternative example, the processing circuitry 150 may execute the LASER (Localization By Adiabatic Selective Refocusing) sequence. In an alternative example, the processing circuitry 150 may use other single voxel technique. In an alternative example, the processing circuitry 150 may use multi-voxel technique such as magnetic resonance spectroscopic imaging (MRSI) or chemical shift imaging.

By the sequence control circuitry 120 applying MT pulses prior to the MRS pulse sequence, changes appear in the MRS spectrum. Thus, for example, the processing circuitry 150 performs a subtraction processing between the MRS spectrum acquired in a case in which no MT pulse is applied and the MRS spectrum acquired in a case in which MT pulses are applied, thereby utilizing the acquired spectrum for diagnosis.

Next, the determination method of the frequency of MT pulses which the sequence control circuitry 120 applies prior to the pulse sequence of the magnetic resonance spectroscopy is explained.

Figure 8D:
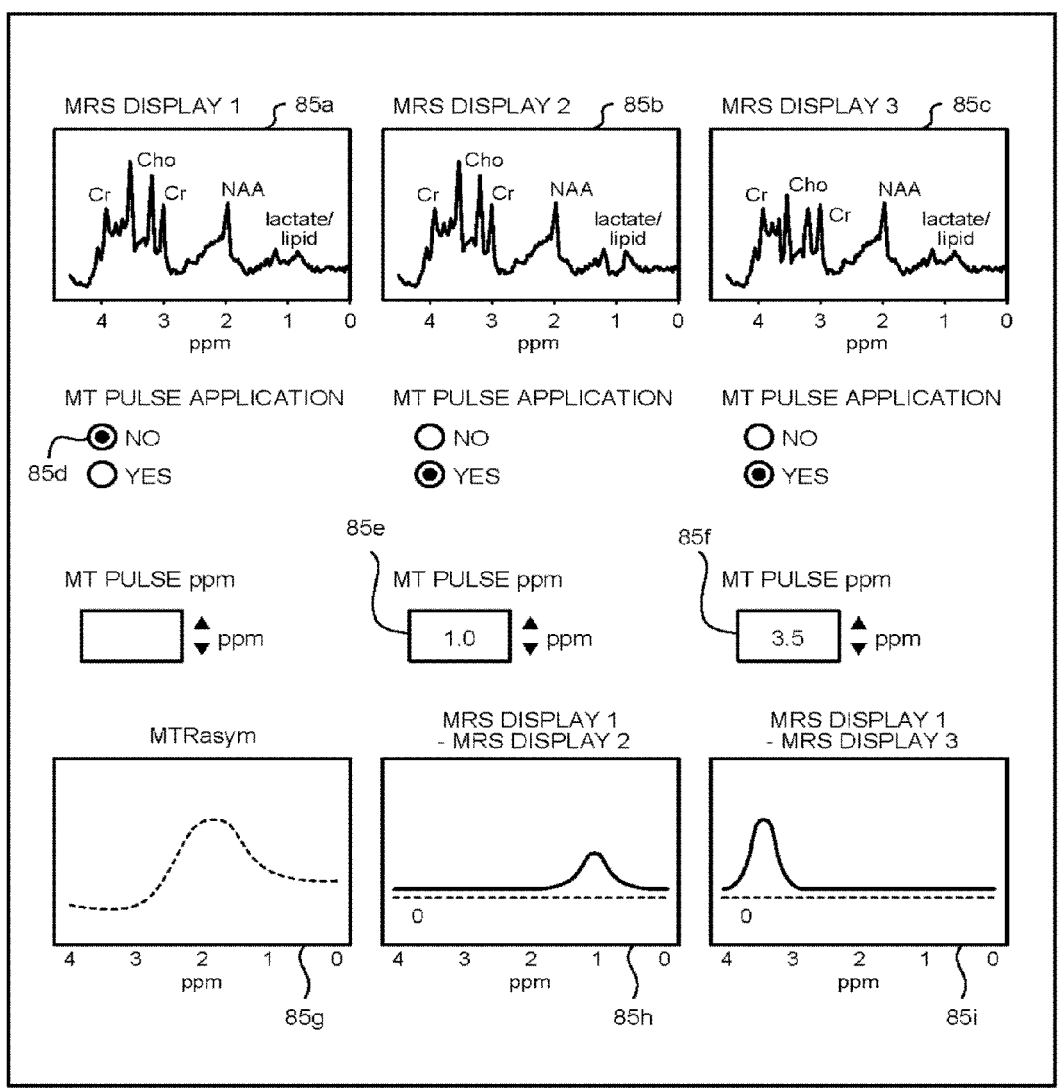
FIG. 8D is a drawing illustrating an example of a GUI (Graphical User Interface) according to the second embodiment.
Figure 8E:
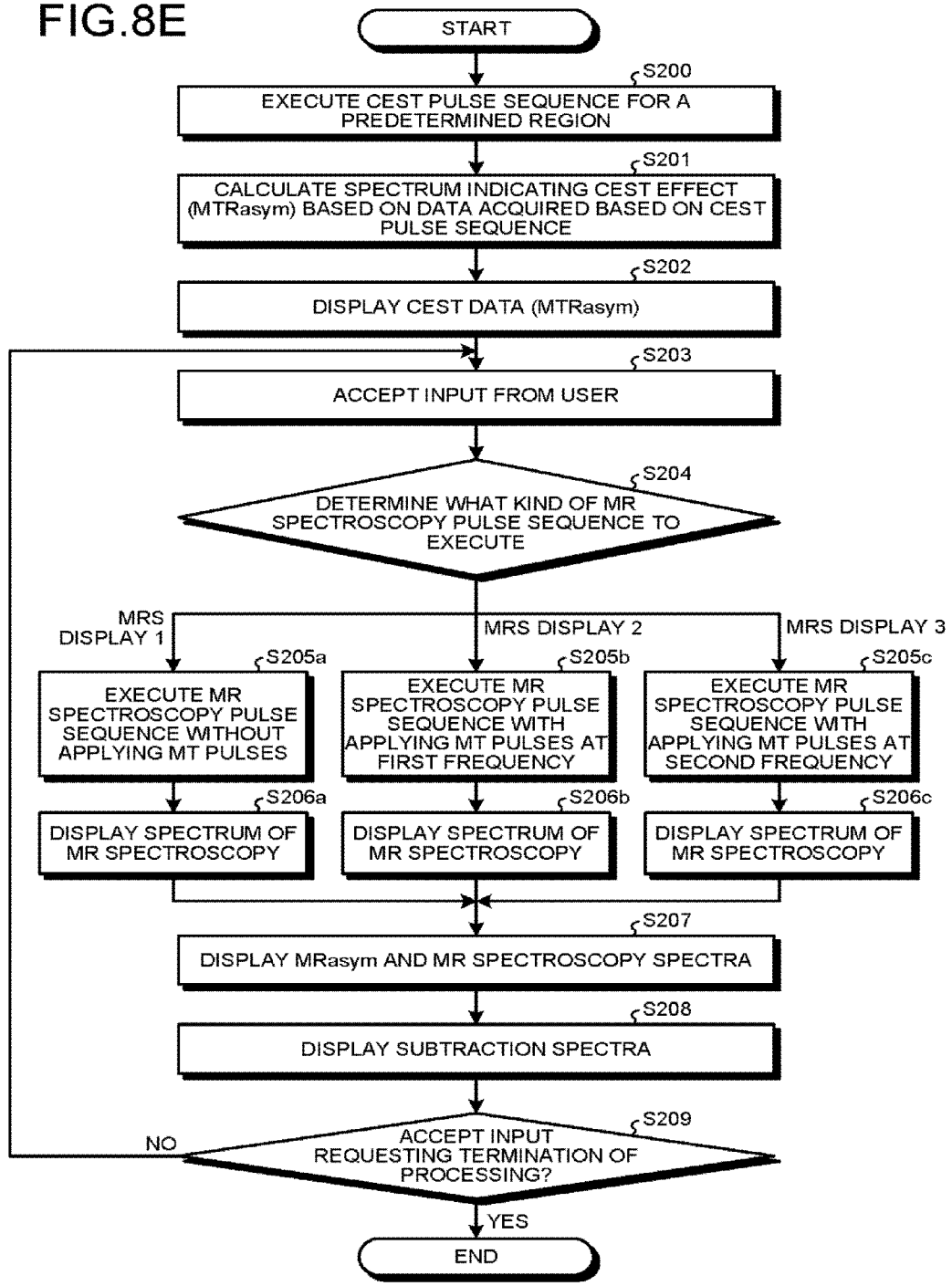
FIG. 8E is a flowchart for explaining an example of procedure of processing performed by a magnetic resonance imaging apparatus according to the second embodiment.

FIG. 8D is a drawing illustrating an example of a GUI (Graphical User Interface) according to the second embodiment. FIG. 8E is a flowchart for explaining an example of procedure of processing performed by a magnetic resonance imaging apparatus according to the second embodiment.

In a panel 85a in FIG. 8D, an MRS spectrum in a normal case is displayed in which the sequence control circuitry 120 does not apply MT pulses (MRS display one). In a panel 85b, an MRS spectrum in a case is displayed in which the sequence control circuitry 120 applies MT pulses at a first frequency prior to the pulse sequence of the magnetic resonance spectroscopy (MRS display two). Here, the first frequency is, for example, +1.0 ppm, with the resonance frequency of the free water protons being the reference. Further, in a panel 85c, an MRS spectrum in a case is displayed in which the sequence control circuitry 120 applies MT pulses at a second frequency prior to the pulse sequence of the magnetic resonance spectroscopy (MRS display three). Here, the second frequency is, for example, +3.5 ppm, with the resonance frequency of the free water protons being the reference.

Further, a button 85d is a button for the user to select whether or not to apply the MT pulses prior to the pulse sequence of the magnetic resonance spectroscopy to be executed. Further, a button 85e and a button 85f are buttons for the user to select the frequency of the MT pulses to be applied prior to the pulse sequence of the magnetic resonance spectroscopy to be executed.

Further, in a panel 85g, the MTRasym spectrum is displayed. Further, in a panel 85h, a subtraction spectrum between the spectrum illustrated in the panel 85a (MRS display one) and the spectrum illustrated in the panel 85b (MRS display two) is illustrated. Further, in a panel 85i, a subtraction spectrum between the spectrum illustrated in the panel 85a (MRS display one) and the spectrum illustrated in the panel 85b (MRS display three) is illustrated.

Subsequently, with reference to FIG. 8E, the procedure of processing performed by the magnetic resonance imaging apparatus 100 according to the second embodiment is explained.

First of all, the sequence control circuitry 120 executes the CEST pulse sequence for a predetermined region (for example, a region that is of interest) (Step S200). In other words, the sequence control circuitry 120 executes the CEST pulse sequence performing magnetic resonance imaging by applying MT pulse(s) of a predetermined frequency (Step S201). Subsequently, the processing circuitry 150 calculates a spectrum indicating an amount of the CEST (Chemical Exchange Saturation Transfer) effect (e.g. the MTRasym spectrum), based on data acquired based on the CEST pulse sequence executed at Step S200 by the sequence control circuitry 120 (Step S201). Subsequently, by the control function 133, the processing circuitry 150 causes the display 135 to present the CEST data (the MTRasym). The display 135 displays the CEST data (MTRasym), for example on the panel 85g (Step S202).

Subsequently, by the control function 133, the processing circuitry 150 accepts an input from the user by the input device 134 (Step S203). For example, by the button 85d displayed on the display 135, the processing circuitry 150 accepts an input as to whether MT pulses are to be applied or not in the pulse sequence of the magnetic resonance spectroscopy to be executed. Further, for example by the button 85e or the button 85f, the processing circuitry 150 accepts an input of the frequency of the MT pulses to be applied by the sequence control circuitry 120 during the pulse sequence of the magnetic resonance spectroscopy to be executed.

Subsequently, by the control function 133, the processing circuitry 150 determines what kind of pulse sequence of the magnetic resonance spectroscopy is to be executed based on an input accepted from the user at Step S203 (Step S204).

For example, in a case in which the input accepted from the user at Step S203 is "application of the MT pulses: NO" (Step S204: first MRS display one), the sequence control circuitry 120 executes the pulse sequence of the magnetic resonance spectroscopy without applying an MT pulse (Step S205a). The processing circuitry 150 generates data based on the pulse sequence executed in which no MT pulse is applied at S205a. Specifically, the processing circuitry 150 calculates the MRS spectrum based on the pulse sequence executed by the sequence control circuitry 120 at Step S205a. By the control function 133, the processing circuitry 150 causes the display 135 to display the MRS spectrum calculated (Step S206a). For example, by the control function 133, the processing circuitry 150 causes the MRS spectrum thus calculated to be displayed on the panel 85a on the display.

Further, for example, in a case in which the input accepted from the user at Step S203 is "application of the MT pulses: YES" and the first frequency is selected for the frequency of the MT pulses, (for example, in a case in which the first frequency is selected to be 1.0 ppm by the button 85e), (Step S204: MRS display two), the sequence control circuitry 120 applies MT pulses based on a input accepted at Step S203 by the processing circuitry 150. In other words, the sequence control circuitry 120 executes a pulse sequence of the magnetic resonance spectroscopy applying MT pulses at the first frequency (Step S205b). The processing circuitry 150 calculates predetermined data (MRS spectrum) based on the pulse sequence which the sequence control circuitry 120 executed at Step S205b after applying the MT pulses. By the control function 133, the processing circuitry 150 causes the MRS spectrum thus calculated to be displayed on the display 135 (Step S206b). For example, by the control function 133, the processing circuitry 150 causes the MRS spectrum thus calculated to be displayed on the panel 85b on the display 135.

Further, for example, in a case in which the input accepted from the user at Step S203 is "application of the MT pulses YES" and the second frequency is selected for the frequency of the MT pulses, (for example, in a case in which the second frequency is selected to be 3.5 ppm by the button 85f), (Step S204: MRS display three), the sequence control circuitry 120 applies the MT pulses based on the input accepted at Step S203 by the processing circuitry 150. In other words, the sequence control circuitry 120 executes a pulse sequence of the magnetic resonance spectroscopy applying the MT pulses at the second frequency (Step S205c). The processing circuitry 150 calculates the MRS spectrum based on the pulse sequence which the sequence control circuitry 120 executed at Step S205c. By the control function 133, the processing circuitry 150 causes the display 135 to display the MRS spectrum this calculated (Step S206c). For example, by the control function 133, the processing circuitry 150 causes the MRS spectrum thus calculated to be displayed on the panel 85c on the display 135.

The processing circuitry 150 causes the display 135 to display the spectrum indicating the CEST effect (for example, the MTRasym spectrum) and the MTRasym spectrum generated by the sequence control circuitry 120 through the Step S205a, Step S205b and Step S205c. The display 135 displays those MTRasym and MRS spectrum (Step S207).

Subsequently, the processing circuitry 150 performs a subtraction processing between the MRS spectrum in a case in which no MT pulse is applied and the MRS spectrum in a case in which the MT pulses are applied, thereby generating a subtraction spectrum. The processing circuitry 150 causes the subtraction spectrum thus generated to be displayed on the display 135. The display 135 displays the subtraction spectrum (Step S208). For example, the processing circuitry 150 performs the subtraction processing between the MRS spectrum as displayed on the panel 85a in the case in which no MT pulse is applied and the MRS spectrum as displayed on the panel 85b in the case in which the MT pulses are applied, thereby generating the subtraction spectrum. Furthermore, the processing circuitry 150 causes the subtraction spectrum thus generated to be displayed on the panel 85h on the display 135. In other words, the processing circuitry 150 performs the subtraction processing between the data generated at Step S206a and the data generated at Step S206b, thereby generating the data after subtraction. Furthermore, the processing circuitry 150 causes the display 135 to present the data after subtraction thus generated. Further, for example, the processing circuitry 150 performs the subtraction processing between the MRS spectrum as displayed in the panel 85a in the case in which no MT pulse is applied and the MRS spectrum as displayed in the panel 85c in the case in which the MT pulses are applied, thereby generating the subtraction spectrum. Furthermore, the processing circuitry 150 causes the subtraction spectrum thus generated to be displayed on the panel 85i on the display 135.

Subsequently, by the interface function 131, the processing circuitry 150 accepts an input requesting that the processing be terminated by the input device 134 (Step S209). In a case in which, by the interface function 131, the processing circuitry 150 accepts the input requesting that the processing be terminated (Step S209 Yes), the processing is terminated. Further, in a case in which the input requesting that the processing be terminated is not input (Step S209 No), the processing returns to Step S203.

At Step S203, the case is explained in which the processing circuitry 150 accepts the input from the user, and based on the result of the input, the processing circuitry 150 determines what kind of pulse sequence of the magnetic resonance spectroscopy is to be executed at Step S204. However, embodiments are not limited to this situation. For example, instead of Step S203, based on the spectrum indicating the amount of the CEST effect calculated by the processing circuitry 150 at Step S201 (i.e. the MTRasym spectrum), the processing circuitry 150 may calculate the frequency of the MT pulses to be applied in the pulse sequences of Step S205a, Step S205b, Step S205c and the like. In this case, the sequence control circuitry 120 applies MT pulses at a frequency calculated by the processing circuitry 150. Subsequently, after applying MT pulses of the frequency thus calculated, the sequence control circuitry 120 executes pulse sequences of Step S205a, Step S205b, Step S205c and the like.

Third Embodiment

In the first embodiment, the case is explained in which by the control function 133, the processing circuitry 150 performs the control, causing the CEST spectrum and the MTRasym spectrum in addition to the MRS spectrum to be displayed on the display 135. Further, in the second embodiment, the case is explained in which the sequence control circuitry 120 applies the MT pulses and acquires the MRS spectrum. At this time, for example, the frequency of the MT pulses applied is determined based on the CEST data.

In the third embodiments, in relation to the previous embodiments, various variation of the GUI is explained.

First of all, for example, the sequence control circuitry 120 executes a first pulse sequence (the pulse sequence of the magnetic resonance spectroscopy) executing magnetic resonance spectroscopy. Subsequently, by the image generation function, the processing circuitry 150 generates the MRS (Magnetic Resonance Spectroscopy) spectrum based on the pulse sequence of the magnetic resonance spectroscopy executed by the sequence control circuitry 120. Subsequently, the sequence control circuitry 120 causes the display 135 to display the MRS spectrum which the processing circuitry 150 generated by the image generation function 136. The display 135 displays the MRS spectrum which the processing circuitry 150 generated by the image generation function 136. In other words, the processing circuitry 150 causes the display 135 serving as the display unit to present the first data acquired based on the first pulse sequence.

Subsequently, the processing circuitry 150 accepts an input of parameters regarding the CEST pulse sequence. In other words, the processing circuitry 150 accepts, from the user, an input of an imaging condition during the second pulse sequence. Here, the imaging condition is, for example, an input of information regarding the MT pulse applied during the second pulse sequence. Here, the information regarding the MT pulse is the frequency of the MT pulse applied (irradiated).

A specific example of such GUI is illustrated in the top-right part of FIG. 10. A CEST condition configuration screen 75 is a screen on which by the control function 133, the processing circuitry 150 accepts an input of the configuration condition of the second pulse sequence (the CEST pulse sequence) from the user by the input device 134.

When the user selects a button 75a, the processing circuitry 150 manually accepts the configuration of the frequency of the MT pulses applied (irradiated). When the user selects a button 75c, the processing circuitry 150 receives an input requesting that the MT pulses be applied in a single frequency, as the kind of MT pulses to be applied by the sequence control circuitry 120.

Further, when the user selects a button 75d, the processing circuitry 150 receives an input requesting that the MT pulses be applied in a plurality of frequencies, as the kind of MT pulses to be applied by the sequence control circuitry 120. Here, as an example of "the MT pulses are applied in a plurality of frequencies", the sequence control circuitry 120 applies MT pulses, the plurality of frequency components constituting one MT pulse. As an alternative example, the sequence control circuitry 120 applies MT pulses in a plurality of frequencies as a whole, applying a plurality of MT pulses in total in the pre-sequence, each of the plurality of MT pulses having a single frequency and a different frequency. To put it another way, in this case, the processing circuitry 150 accepts an input of the imaging condition in which the sequence control circuitry 120 applies a plurality of MT pulses during the second pulse sequence, including an MT pulse having a first frequency component and an MT pulse having a second frequency component different from the first frequency component.

Further, by the CEST condition configuration screen 75, the processing circuitry 150 accepts an input or change of the frequency of the MT pulses applied (irradiated). For example, in a case in which the user clicks a button 75e, the processing circuitry 150 accepts an input requesting that the frequency of the MT pulses applied by the sequence control circuitry 120 be increased. Further, for example, in a case in which the user clicks a button 75f, the processing circuitry 150 accepts an input requesting that the frequency of the MT pulses applied by the sequence control circuitry 120 be decreased.

Further, the frequency value of the MT pulses applied by the sequence control circuitry 120 may be configured in advance as the initial value. For example, in a case in which the user clicks a button 75g, the processing circuitry 150 performs a configuration so that the frequency of the MT pulses applied by the sequence control circuitry 120 becomes "amide 3.5 ppm".

The sequence control circuitry 120 may execute a plurality of pulse sequences by changing the frequency of the MT pulses, thereby performing automatic data acquisition. For example, in a case in which the user clicks a button 75b, the sequence control circuitry 120 executes the plurality of pulse sequences, by changing the frequency of the MT pluses applied, from −6.0 ppm to 6.0 ppm, with the ppm interval being 1.0 ppm.

Further, by the CEST condition configuration screen 75, the processing circuitry 150 accepts an input as to whether the application of the saturation pulse is "on" or "off". For examples, in a case in which the user clicks a button 75h, whether the application of the saturation pulse is "on" or "off" is switched. It is noted that in the case in which the application of the saturation pulse is "off", the pulse sequence which the sequence control circuitry 120 executes becomes the normal pulse sequence, as the sequence control circuitry 120 does not apply MT pulses in that case.

At this time, the sequence control circuitry 120 further executes a third pulse sequence not applying an MT pulse. The processing circuitry 150 allows switchable presentation of either third data acquired based on the third pulse sequence or the second data (e.g. CEST spectrum or MTRasym spectrum).

Further, the processing circuitry 150 may accept an input of the application time duration of the MT pulses applied by the sequence control circuitry 120.

In this case, upon the processing circuitry 150 accepting an input of parameters corresponding to the CEST pulse sequence by the control function 133, the sequence control circuitry 120 executes the CEST pulse sequence based on the parameter that is input. In other words, the sequence control circuitry 120 executes the second pulse sequence based on the input accepted.

Subsequently, by the image generation function 136, the processing circuitry 150 generates a spectrum indicating the amount of the CEST effect. Subsequently, by the image generation function 136, the processing circuitry 150 displays the MRS spectrum and a spectrum indicating the amount of the CEST effect. In other words, the processing circuitry 150 causes the display 135 serving as the display unit to display the second data acquired based on the second pulse sequence.

As described above, in the third embodiment, various GUIs displaying the result of the magnetic resonance imaging using the result of the magnetic resonance spectroscopy and the CEST. Owing to the magnetic resonance imaging apparatus 100 according to the third embodiment, convenience for users is further increased. Further, in the third embodiment, a GUI that executes the CEST pulse sequence based on the result of the magnetic resonance spectroscopy is explained. Owing to the magnetic resonance imaging apparatus 100 according to the third embodiment, users can choose the appropriate CEST imaging condition. Consequently, convenience for the users is further increased.

Fourth Embodiment

In the first embodiment, the case is explained in which the processing circuitry 150 causes the display 135 to display, as spectra, the result of the magnetic resonance spectroscopy and the result of the CEST imaging. In the fourth embodiment, the processing circuitry 150 not only causes the display 135 to display the spectra but also calculates the estimate value of the concentration of a certain molecule present in the region of interest, based on the data generated by the pulse sequence of the magnetic resonance spectroscopy and data generated by the CEST imaging.

Figure 9:
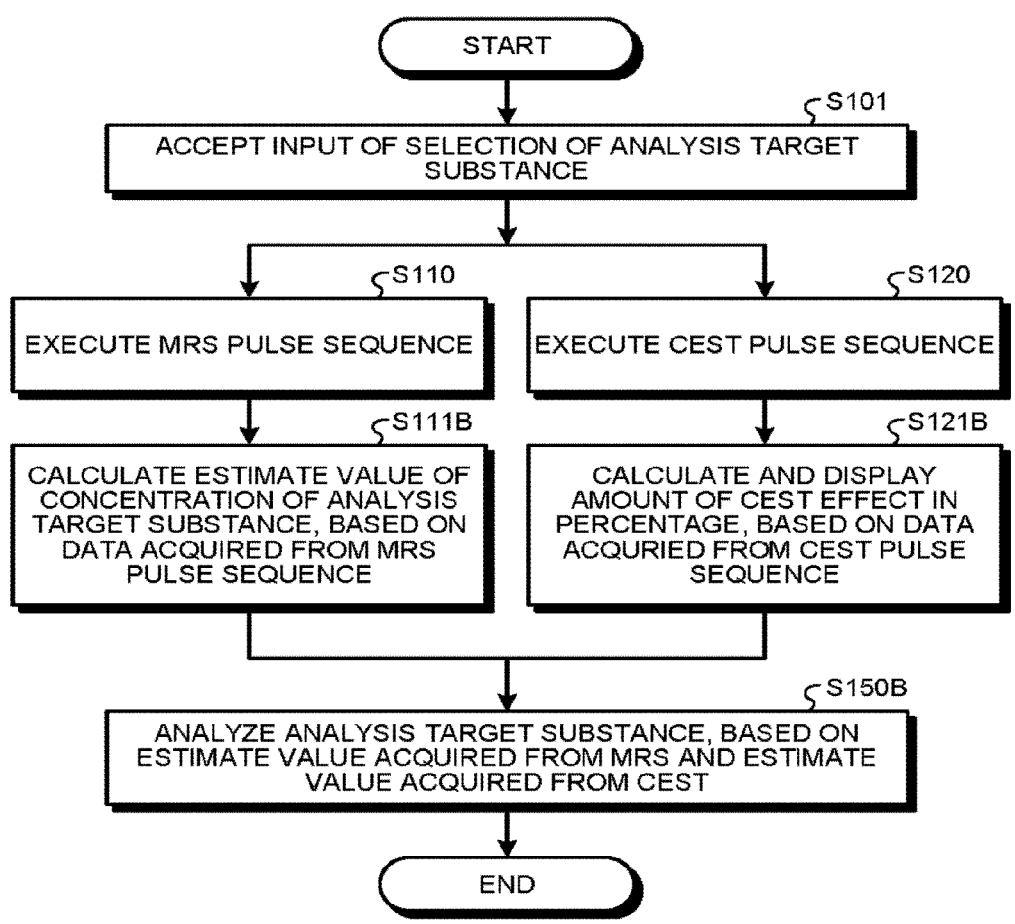
FIG. 9 is a flowchart for explaining an example of procedure of processing performed by a magnetic resonance imaging apparatus according to the fourth embodiment.

FIG. 9 illustrates this situation. FIG. 9 is a flowchart for illustrating an example of procedure performed by the magnetic resonance imaging apparatus according to the fourth embodiment.

First of all, by the control function 133, the processing circuitry 150 accepts an input of the selection of analysis target substance by a predetermined interface (Step 3101). An example of this interface is illustrated in the bottom-right part of FIG. 10. An analysis interface 76 is an interface for accepting the input of the selection of the analysis target substance and for displaying the analysis result. By the control function 133, the processing circuitry 150 accepts an input requesting that the analysis target substance be "N-Acetylaspartic acid" by the analysis interface 76. Further, the processing circuitry 150 may accept an input requesting that the analysis target substance be "creatine" or "Choline" by the analysis interface 76.

Similarly to the first embodiment, the sequence control circuitry 120 executes a pulse sequence of the magnetic resonance spectroscopy (Step S110). Subsequently, by the image generation function 136, the processing circuitry 150 generates the MRS spectrum. By the calculation function not illustrated, the processing circuitry 150 calculates the estimate value of the concentration of the analysis target substance, based on the data acquired from the pulse sequence of the magnetic resonance spectroscopy executed by the sequence control circuitry 120 at Step S110 (Step S111B). By the control function 133, the processing circuitry 150 causes the display 135 to display the estimate value of the concentration of the analysis target substance calculated by the calculation function by the processing circuitry 150 at Step S111B. The display 135 displays the estimate value of the concentration of the analysis target substance calculated.

Let us consider a case in which, for example, in FIG. 10, by the calculation function, at Step S111B, the processing circuitry 150 calculates that the estimate value of the concentration of the N-Acetylaspartic acid that is the analysis target substance is 7.2 mmol/ml. In this case, the display 135 presents that the estimate value of the concentration of the N-Acetylaspartic acid calculated by the magnetic resonance spectroscopy is 7.2 mmol/ml.

On the other hand, the sequence control circuitry 120 executes the CEST pulse sequence at Step S120 (Step S120). The processing circuitry 150 calculates the MTRasym spectrum by the image generation function 136. By the calculation function, the processing circuitry 150 calculates the amount of the CEST effect, based on data acquired from the CEST pulse sequence executed by the sequence control circuitry 120 at Step S120. For example, by the calculation function, the processing circuitry 150 calculates the amount of the CEST effect, for example, by the percentage, with the Z spectrum in the case in which MT pulses are not applied being the reference. By the control function 133, the processing circuitry 150 causes the display 135 serving as the display unit to present the amount of the CEST effect calculated by the calculation function at Step S121B by the processing circuitry 150 (Step S121B). By the control function 133, the processing circuitry 150 causes the display 135 to display the estimate value of the amount of the CEST effect calculated by the calculation function at Step S121B by the processing circuitry 150. The display 135 displays the amount of the CEST effect of the analysis target substance thus calculated.

As an example, by the calculation function, the processing circuitry 150 refers to the result of the analysis performed at Step S111B by the processing circuitry 150. Subsequently, the processing circuitry 150 acquires data corresponding to the analysis target substance from a certain database included, for example, in the storage circuitry 132. For example, the processing circuitry 150 acquires, for the analysis target substance "N-Acetylaspartic acid", for example, the value of the velocity of the chemical exchange $k_{sw}$ between a certain functional group (e.g. the protons in the OH 40a, the OH 40b or the amide group 40c in FIG. 2A) from the certain database.

Subsequently, by the calculation function, the processing circuitry 150 integrates the analysis result for each functional group, thereby calculating the estimate value of the concentration of the N-Acetylaspartic acid by the CEST method. For example, by the calculation function, the processing circuitry 150 calculates that the concentration of the N-Acetylaspartic acid is 4.0 mmol/ml according to the CEST method. By the calculation function, the processing circuitry 150 causes the display 135 to display the analysis result, for example, by the analysis interface 76 in FIG. 10.

Subsequently, by the calculation function, the processing circuitry 150 decomposes the MTAasym spectrum for each of the functional groups. The processing circuitry 150 compares, for each of the functional groups, the contribution of the MTAsym spectrum that is previously decomposed into, with the value of the velocity of the chemical exchange acquired, thereby calculating the estimate value of the concentration of the analysis target substance for each predetermined functional group. For example, by the calculation function, the processing circuitry 150 calculates that the OH 40a concentration in the N-Acetylaspartic acid is 4.2 mmol/ml. Further, by the calculation function, the processing circuitry 150 calculates that the OH 40b concentration in the N-Acetylaspartic acid is 4.4 mmol/ml. Further, by the calculation function, the processing circuitry 150 calculates that the concentration of the amide group 40c in the N-Acetylaspartic acid is 3.8 mmol/ml. By the control function 133, the processing circuitry 150 causes the display 135 to display the analysis result through the analysis interface 76 in FIG. 10.

Subsequently, by the calculation function, the processing circuitry 150 calculates the overall estimate value of the concentration of the analysis target substance (Step S150B). This process is based on the estimate value of the concentration of the analysis target substance by the magnetic resonance spectroscopy calculated by the calculation function at Step S111B by the processing circuitry 150 and the estimate value of the concentration of the analysis target substance by the CEST calculated by the calculation function at Step S121B by the processing circuitry 150. To put it another way, the processing circuitry 150 calculates the estimate value of the concentration of a certain molecule present within the region of interest, based on the first data acquired based on the first pulse sequence (the magnetic resonance spectroscopy) and the second data acquired based on the second pulse sequence (the CEST pulse sequence). As for the calculation method of the overall estimate value of the concentration of the analysis target substance, the processing circuitry 150 may calculate the estimate value using simple averaging or may calculate the estimate value using weighted averaging. For example, by the calculation function, the processing circuitry 150 calculates that the overall evaluation value of the concentration of the N-Acetylaspartic acid is 5.2 mmol/ml. By the control function 133, the processing circuitry 150 causes the display 135 to display the analysis result, for example, through the analysis interface 76 in FIG. 10.

Subsequently, the processing circuitry 150 compares the concentration of the analysis target substance thus calculated with a predetermined threshold and causes the display 135 to display the result thus compared. For example, in the above-described case, since the concentration of the N-Acetylaspartic acid calculated is lower than the predetermined threshold, the processing circuitry 150 determines, by the calculation function, that the Alzheimer's disease is suspected and causes the display 135 to display "Concentration of the N-Acetylaspartic acid is notably low. The Alzheimer's disease is suspected."

Embodiments are not limited to this situation. At Step S101, a case is explained in which the processing circuitry 150 accepts an input of the selection of the analysis target substance. However, embodiments are not limited to this situation. For example, the processing circuitry 150 may accept an input of the analysis target substance at Step S101 by using an input method other than the input of the selection.

Further, similarly to the first embodiment, the order of the execution of Step S110 and Step S111B and the order of the execution of Step S120 and Step S121B is arbitrary. In the embodiments, the case is explained in which at Step S121B, the processing circuitry 150 having the calculation function refers to the analysis result of the magnetic resonance spectroscopy calculated at Step S111B by the processing circuitry 150, but embodiments are not limited to this example. In other words, for example, the processing of Step S111B may be performed subsequent to Step S121B.

Computer Programs

Further, the instructions presented in the processing procedures described in the above embodiments may be executed according to a computer program (hereinafter, "program") that is software. It is possible to achieve the same advantageous effects as those from the magnetic resonance imaging apparatus 100 in the above embodiments, by causing a general-purpose computer to store the program therein in advance and to read the program. The instructions described in the above embodiments are recorded as a computer-executable program onto a magnetic disk (e.g., a flexible disk, a hard disk), an optical disc (e.g., a Compact Disc Read-Only Memory [CD-ROM], a Compact Disc Recordable [CD-R], a Compact Disc Rewritable [CD-RW], a Digital Versatile Disk Read-Only Memory [DVD-ROM], a Digital Versatile Disk Recordable [DVD±R], a Digital Versatile Disk Rewritable [DVD±RW]), a semiconductor memory, or the like. Any storage format can be used, as long as a computer or an incorporated system is able to read data from the storage medium. The computer is able to realize the same operations as those performed by the magnetic resonance imaging apparatus 100 described in the above embodiments, by reading the program from the recording medium and having the CPU execute the instructions written in the program according to the read program. Further, when obtaining or reading the program, the computer may obtain or read the program via a network.

Further, according to the instructions in the program installed from the storage medium into the computer or the incorporated system, an Operating System (OS) working in the computer, middleware (MW) such as database management software or a network may execute a part of the processes performed for realizing the embodiments described above. Further, the storage medium does not necessarily have to a medium that is independent of the computer or the incorporated system. The storage medium may be such a storage medium that stores therein or temporarily stores therein the downloaded program transferred via a Local Area Network (LAN), the Internet, or the like. Further, the storage medium does not necessarily have to be one. Even the situation where the processes described in the above embodiments are executed from a plurality of media is included in possible modes of the storage medium implementing the embodiments. The medium/media may have any configuration.

Further, the computer or the incorporated system used in any of the embodiments is configured to execute the processes described in the above embodiments according to the program stored in the storage medium. The computer or the incorporated system may be configured by using a single apparatus such as a personal computer or a microcomputer or may be configured by using a system in which a plurality of apparatuses are connected together via a network. Furthermore, the computer used in any of the embodiments does not necessarily have to be a personal computer and may be an arithmetic processing apparatus, a microcomputer, or the like included in an information processing device. The term "computer" generally refers to any device or apparatus that is capable of realizing the functions described in the embodiments by using the program.

A Hardware Configuration

Figure 11:
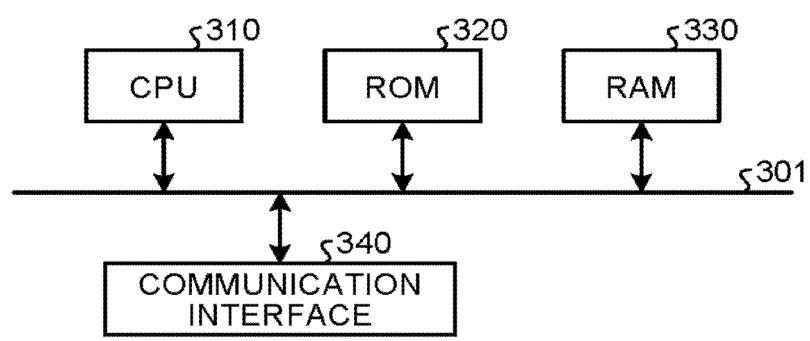
FIG. 11 is a diagram illustrating a hardware configuration of an image processing apparatus according to an embodiment.

FIG. 11 is a diagram of a hardware configuration of a computer 130 (image processing apparatus) according to an embodiment. The image processing apparatus according to the embodiments described above includes a controlling device such as a Central Processing Unit (CPU) 310, storage devices such as a Read-Only Memory (ROM) 320 and a Random Access Memory (RAM) 330, a communication interface (I/F) 340 that connects to a network and performs communication, and a bus 301 that connects the units together.

The program executed by the image processing apparatus according to the embodiments described above is provided as being incorporated, in advance, in the ROM 320 or the like. Further, the program executed by the image processing apparatus according to the embodiments described above is able to cause the computer to function as the units of the image processing apparatus described above. The computer is configured so that the CPU 310 is able to read the program from a computer-readable storage medium into a main storage device and to execute the read program.

According to a magnetic resonance imaging apparatus and a magnetic resonance imaging method according to at least one of the embodiments, it is possible to appropriately depict fluids.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
sequence control circuitry configured to apply a first MT (Magnetization Transfer) pulse, and execute a first pulse sequence performing MR (Magnetic Resonance) spectroscopy after the first MT pulse is applied.

2. The magnetic resonance imaging apparatus according to claim 1, wherein the first pulse sequence includes a STEAM (Stimulated Echo Acquisition Mode) sequence or a PRESS (Point Resolved Spectroscopy Sequence).

3. The magnetic resonance imaging apparatus according to claim 1, further comprising processing circuitry configured to accept, from a user, an input of a frequency of the first. MT pulse applied by the sequence control circuitry, wherein
the sequence control circuitry is further configured to apply the first MT pulse based on the input accepted by the processing circuitry.

4. The magnetic resonance imaging apparatus according to claim 1,
wherein the sequence control circuitry is further configured to execute a second pulse sequence performing magnetic resonance imaging by applying a second MT pulse,
and the apparatus further comprises processing circuitry configured to calculate a spectrum indicating an amount of CEST (Chemical Exchange Saturation Transfer) effect based on data acquired based on the second pulse sequence and calculate a frequency of the first MT pulse, to be applied during the first pulse sequence based on the calculated spectrum,
wherein the sequence control circuitry is further configured to apply the first MT pulse calculated by the processing circuitry and execute the first pulse sequence after the first MT pulse is applied.

5. The magnetic resonance imaging apparatus according to claim 4, wherein the processing circuitry is further configured to cause a display to present a spectrum indicating an amount of the CEST effect and an MRS (Magnetic Resonance Spectroscopy) spectrum acquired from the first pulse sequence.

6. The magnetic resonance imaging apparatus according to claim 1, wherein the sequence control circuitry is further configured to execute the first pulse sequence without applying an MT pulse. and the apparatus further comprises
processing circuitry configured to generate first data based on the first pulse sequence executed after the first MT pulse is applied, generate second data based on the first pulse sequence executed without applying an MT pulse, and perform a subtraction processing between the first data and the second data, thereby generating third data.

7. A magnetic resonance imaging apparatus, comprising:
sequence control circuitry configured to execute a first pulse sequence performing MR (Magnetic Resonance) spectroscopy and configured to execute a second pulse sequence applying an MT Magnetization Transfer) pulse and
processing circuitry configured to cause a display to present first data acquired based on the first pulse sequence and second data acquired based on the second pulse sequence.

8. The magnetic resonance imaging apparatus according to claim 7, wherein the processing circuitry is further configured to cause the display to present an MRS (Magnetic Resonance Spectroscopy) spectrum acquired based on the, first pulse sequence and a spectrum acquired base on the second pulse sequence and indicating an amount of CEST (Chemical Exchange Saturation Transfer) effect.

9. The magnetic resonance imaging apparatus according to claim 7, wherein
the processing circuitry is further configured to cause the display to present the first data acquired based on the first pulse sequence and configured to accept, from a user, an input of an imaging condition during the second pulse sequence based on a result displayed;
the sequence control circuitry is further configured to execute the second pulse sequence based on the input accepted; and
the processing circuitry is further configured to cause the display to present the second data acquired based on the second pulse sequence.

10. The magnetic resonance imaging apparatus according to claim 9, wherein
the processing circuitry is further configured to accept an input of information regarding the MT pulse applied during the second pulse sequence.

11. The magnetic resonance imaging apparatus according to claim 10, wherein the information regarding the MT pulse is a frequency of the MT pulse applied.

12. The magnetic resonance imaging apparatus according to claim 9, wherein the processing circuitry is further configured to accept an input of the imaging condition in which the sequence control circuitry applies a plurality of MT pulses during the second pulse sequence, including an MT pulse having a first frequency component and an MT pulse having a second frequency component different from the first frequency component.

13. The magnetic resonance imaging apparatus according to claim 7, wherein the sequence control circuitry is further configured to execute a third pulse sequence not applying an MT pulse and the processing circuitry is further configured to allow switchable presentation, of either third data acquired based, on the third pulse sequence or the second data.

14. The magnetic resonance imaging apparatus according to claim 7, wherein the sequence control circuitry is further configured to execute the second pulse sequence by concurrently acquiring data for a plurality of slices.

15. The magnetic resonance imaging apparatus according to claim 7, wherein the processing circuitry is further configured to calculate, based on the first data and the second data, an estimate value of concentration of a specific molecule present in a region of interest.

16. A magnetic resonance imaging method executed in a magnetic resonance in apparatus, comprising:

executing a first pulse sequence performing MR (Magnetic Resonance) spectroscopy and a second pulse sequence in which an MT (Magnetization Transfer) pulse is applied; and causing first data acquired based on the first pulse sequence and second data acquired based on the second pulse sequence to be presented on a display.

* * * * *